(12) United States Patent
Chang et al.

(10) Patent No.: US 10,498,212 B2
(45) Date of Patent: Dec. 3, 2019

(54) GATE DRIVER

(71) Applicant: Dialog Semiconductor (UK) Limited, London (GB)

(72) Inventors: Kevin Chang, Tempe, AZ (US); Mark Mercer, Phoenix, AZ (US); Michael Jayo, Gilbert, AZ (US)

(73) Assignee: Dialog Semiconductor (UK) Limited, London (GB)

( * ) Notice: Subject to any disclaimer, the term of this patent is extended or adjusted under 35 U.S.C. 154(b) by 38 days.

(21) Appl. No.: 15/662,583

(22) Filed: Jul. 28, 2017

(65) Prior Publication Data

US 2018/0342941 A1 Nov. 29, 2018

Related U.S. Application Data

(60) Provisional application No. 62/511,375, filed on May 26, 2017.

(51) Int. Cl.
*H02M 1/08* (2006.01)
*H03K 17/687* (2006.01)
(Continued)

(52) U.S. Cl.
CPC .............. *H02M 1/08* (2013.01); *H03H 11/04* (2013.01); *H03K 17/162* (2013.01);
(Continued)

(58) Field of Classification Search
CPC ............................... H02M 1/08; H03K 17/687
(Continued)

(56) References Cited

U.S. PATENT DOCUMENTS 4,937,722 A * 6/1990 Deierlein .............. H02M 3/156
323/285
5,270,875 A * 12/1993 Shah ................ G11B 20/10009
360/46

(Continued)

FOREIGN PATENT DOCUMENTS

EP 0 655 830 5/1995

OTHER PUBLICATIONS

"Switching-Behavior Improvement of Insulated Gate-Controlled Devices," by Salvator Musumeci et al., IEEE Transactions on Power Electronics, vol. 12, No. 4, Jul. 1997, pp. 645-653.

(Continued)

*Primary Examiner* — Adam D Houston
(74) *Attorney, Agent, or Firm* — Saile Ackerman LLC; Stephen B. Ackerman

(57) ABSTRACT

A gate drive circuit arranged to receive an input signal and provide an output signal to drive a gate of a transistor is presented. The gate drive circuit comprises a filter circuit arranged to attenuate a frequency band from the input signal when deriving the output signal from the input signal. The filter circuit contains programmable resistive elements, comprising: a first programmable resistive element arranged to adjust a low frequency gain and bandwidth of the gate drive circuit; a second programmable resistive element arranged to adjust a high frequency gain of the gate drive circuit; and a pair of programmable resistive elements arranged to adjust a driving gain of the gate drive circuit. A method of receiving an input signal and deriving an output signal from an input signal is also presented. The step of deriving an output signal comprises attenuating a frequency band from the input signal.

22 Claims, 19 Drawing Sheets

(51) Int. Cl.
*H03H 11/04* (2006.01)
*H03K 17/16* (2006.01)
*H03K 19/003* (2006.01)
*H02M 3/155* (2006.01)

(52) U.S. Cl.
CPC ....... *H03K 17/168* (2013.01); *H03K 17/6872* (2013.01); *H03K 19/00361* (2013.01); *H02M 3/155* (2013.01); *H03H 2011/0488* (2013.01); *H03K 2217/009* (2013.01)

(58) Field of Classification Search
USPC .................................................. 327/108–112
See application file for complete search history.

(56) References Cited

U.S. PATENT DOCUMENTS

| | | | | |
|---|---|---|---|---|
| 6,320,438 | B1* | 11/2001 | Arcus | H03K 5/1565 327/165 |
| 6,396,934 | B1* | 5/2002 | Federspiel | H03H 11/1291 330/282 |
| 6,696,869 | B1* | 2/2004 | Tan | H03F 3/45183 327/108 |
| 7,323,912 | B2* | 1/2008 | Nielsen | H03K 17/063 326/83 |
| 8,325,865 | B1* | 12/2012 | Rofougaran | H04B 1/001 375/316 |
| 8,344,810 | B2* | 1/2013 | Lian | H03F 3/187 330/305 |
| 9,774,322 | B1* | 9/2017 | Duduman | H03K 17/223 |
| 10,097,163 | B2* | 10/2018 | Lee | H03H 11/0422 |
| 2002/0008553 | A1* | 1/2002 | Banba | H03F 3/60 327/108 |
| 2003/0058006 | A1* | 3/2003 | Srikanth | H03K 17/162 327/108 |
| 2004/0124891 | A1* | 7/2004 | De Laurentiis | H03G 1/0029 327/112 |
| 2005/0129156 | A1* | 6/2005 | Lourens | H03H 11/1252 375/350 |
| 2008/0036536 | A1* | 2/2008 | Khorramabadi | H01F 17/0013 330/252 |
| 2008/0100374 | A1* | 5/2008 | Papananos | H03H 11/1291 327/553 |
| 2009/0206888 | A1* | 8/2009 | Kitazawa | B41J 2/04541 327/111 |
| 2010/0097152 | A1* | 4/2010 | Wang | H03H 11/1291 331/44 |
| 2010/0117688 | A1* | 5/2010 | Lee | H04L 25/0272 327/108 |
| 2010/0156575 | A1* | 6/2010 | Shah | H03J 3/08 334/78 |
| 2010/0244943 | A1* | 9/2010 | Hahn | H03H 11/1291 327/553 |
| 2010/0244945 | A1* | 9/2010 | Hahn | H03H 7/0153 327/553 |
| 2011/0221480 | A1* | 9/2011 | Ikeda | H03K 17/04123 327/109 |
| 2011/0242172 | A1* | 10/2011 | Yoshino | B41J 2/04541 347/10 |
| 2011/0254644 | A1* | 10/2011 | Nutt | H03K 19/0008 334/39 |
| 2012/0014156 | A1* | 1/2012 | Park | G11C 7/1078 365/51 |
| 2012/0062190 | A1* | 3/2012 | Haiplik | H02M 3/156 323/271 |
| 2012/0130651 | A1* | 5/2012 | Papadimitriou | G01N 27/9046 702/35 |
| 2012/0133420 | A1* | 5/2012 | Draxelmayr | H02M 3/337 327/430 |
| 2012/0146539 | A1* | 6/2012 | Riesebosch | H05B 33/089 315/291 |
| 2012/0256674 | A1* | 10/2012 | Foroudi | H03H 11/245 327/308 |
| 2012/0293248 | A1* | 11/2012 | Chen | H03H 11/1213 327/553 |
| 2013/0009671 | A1* | 1/2013 | Suzuki | H03K 17/164 327/108 |
| 2013/0040592 | A1* | 2/2013 | Lee | H03H 11/1291 455/226.1 |
| 2013/0109334 | A1* | 5/2013 | Kwon | H04B 1/0475 455/114.3 |
| 2013/0154738 | A1* | 6/2013 | Lee | H03G 3/002 330/254 |
| 2013/0169320 | A1* | 7/2013 | van Dijk | H01L 24/73 327/109 |
| 2013/0225101 | A1* | 8/2013 | Basaran | H03H 7/12 455/79 |
| 2013/0265029 | A1* | 10/2013 | Akiyama | H03K 17/94 323/311 |
| 2013/0278341 | A1* | 10/2013 | Tsou | H03F 3/193 330/271 |
| 2014/0002145 | A1* | 1/2014 | Mauder | H03K 17/06 327/109 |
| 2014/0065992 | A1* | 3/2014 | Lee | H03H 11/1291 455/139 |
| 2014/0103962 | A1* | 4/2014 | Ajram | H03K 17/082 327/108 |
| 2014/0333373 | A1* | 11/2014 | Pamarti | H03H 19/00 327/553 |
| 2015/0035622 | A1* | 2/2015 | Maxim | H03F 1/565 333/202 |
| 2015/0094008 | A1* | 4/2015 | Maxim | H01F 17/0013 455/245.1 |
| 2015/0236663 | A1* | 8/2015 | Buer | H03F 3/19 455/20 |
| 2015/0236748 | A1* | 8/2015 | Nobbe | H04B 17/12 455/78 |
| 2015/0381129 | A1* | 12/2015 | Brekelmans | H03G 3/18 330/254 |
| 2016/0006417 | A1* | 1/2016 | Kim | H03K 3/01 327/108 |
| 2016/0254810 | A1* | 9/2016 | Rossberg | H03K 17/04206 327/109 |
| 2016/0352235 | A1* | 12/2016 | Imai | H02M 3/33569 |
| 2016/0365859 | A1* | 12/2016 | Song | H03K 19/018514 |
| 2017/0033759 | A1* | 2/2017 | Saigusa | H04B 1/10 |
| 2017/0149411 | A1* | 5/2017 | Nielsen | H03G 3/3042 |
| 2017/0302243 | A1* | 10/2017 | Horita | H01P 1/20 |
| 2018/0115237 | A1* | 4/2018 | Morin | H02M 3/156 |
| 2018/0294732 | A1* | 10/2018 | Ye | H02M 3/33546 |

OTHER PUBLICATIONS

"An Innovative EMI Reduction Design Technique in Power Converters," by Alfio Consoli et al., IEEE Transactions on Electromagnetic Compatibility, vol. 38, No. 4, Nov. 1996, pp. 567-575.
"Research of Active Gate Drivers for MOSFET by Thermography," by Anna Andonova et al., Proceeding of the 12th WSEAS International Conference on Automatic Control, Modelling & Simulation, Jan. 15, 2016, pp. 253-256.
"Active Gate Voltage Control of Turn-on di/dt and Turn-off dv/dt in Insulated Gate Transistors," by Nadir Idir et al., IEEE Transactions on Power Electronics, vol. 21, No. 4, Jul. 2006, pp. 849-855.
"Efficient Voltage/Current Spike Reduction by Active Gate Signaling," by Arash A. Boora et al., Electromagnetic Compatibility Symposium Adelaide, Australia, Aug. 16-Sep. 18, 2009, pp. 59-64.
"Shaping High-Power IGBT Switching Transitions by Active Voltage Control for Reduced EMI Generation," by Xin Yang et al., IEEE Transactions on Industry Applicatons, vol. 51, No. 2, Mar./Apr. 2015, pp. 1669-1677.
"Design of CMOS Inverter-based Output Buffers Adapting the Cherry-Hooper Broadbanding Technique," by Tomoaki Maekawa et al, European Conference on Circuit Theory and Design, ECCTD 2009, Aug. 23-27, 2009, 4 pgs.
German Office Action, File No. 10 2018 205 304.9, Applicant: Dialog Semiconductor (UK) Limited, dated Feb. 15, 2019, 14 pages, and English language translation, 6 pages.

(56) References Cited

OTHER PUBLICATIONS

"An Efficient Resonant Gate-Drive Scheme for High-Frequency Applications," by Mabesh M. Swamy et al., IEEE Transactions on Industry Applications, vol. 48, No. 4, Jul./Aug. 2012, pp. 1418-1431.

* cited by examiner

GATE DRIVER

This application claims benefit of U.S. Provisional Patent Application 62/511,375, filed on May 26, 2017, which is assigned to a common assignee, and which is herein incorporated by reference in its entirety.

TECHNICAL FIELD

The present disclosure relates to a gate driver and in particular to a gate driver apparatus and gate drive methods for transistor gates.

BACKGROUND

A digital circuit is mostly operated between a first logic state and a second logic state, however an active device can behave like a linear amplifier when transistors are switching between opposite logic states. As a result of a finite gain during switching, the digital circuit may enhance the high frequency spectrum of an input signal and therefore present an overshoot or undershoot waveform at an output.

The efficiency of devices or systems which employ digital circuits can be enhanced by shortening the transition time of gate driving signals which control the operation of transistors provided with the devices or systems. However, this can cause voltage or current spikes and in turn result in problems with high switching noise and generation of electromagnetic interference (EMI). On the other hand, a longer transition time of the gate driving signals to the pass transistors produces higher power-loss and thus reduces power efficiency of the devices or systems. One example device is a switching power converter. In this context and in others it is desirable to have gate driver apparatus that is not too complex to implement, as overly complex solutions increase the bill of materials and circuit area.

SUMMARY

According to a first aspect of the disclosure there is provided a gate drive circuit arranged to receive an input signal and provide an output signal to drive a gate of a transistor, wherein the output signal is derived from the input signal; and comprising a filter circuit arranged to attenuate a frequency band from the input signal when deriving the output signal from the input signal.

The transistor may be a MOSFET transistor, an IGBT transistor or other type of transistor where a voltage or a current applied at a transistor gate terminal controls a voltage or a current between two or more other transistor terminals.

Optionally, the output signal is suitable for switching the transistor between a first state and a second state.

Optionally, the filter circuit (which may alternatively be referred to as a band-stop filter) comprises a resonant circuit.

Optionally, the filter circuit comprises a plurality of programmable resistive elements, comprising: a first programmable resistive element arranged to adjust a low frequency gain and bandwidth of the gate drive circuit; a second programmable resistive element arranged to adjust a high frequency gain of the gate drive circuit; and a pair of programmable resistive elements arranged to adjust a driving gain of the gate drive circuit.

The high frequency gain is at a higher frequency than the low frequency gain and frequency regions defined by these preferably do not overlap.

Optionally, one more of the programmable resistive elements comprise a plurality of resistive elements that are coupled to each other (preferably in series, but alternatively in parallel) and which each resistive element comprises a transmission gate coupled to a resistor.

Optionally, one or more of the programmable resistive elements comprises a current-blocking switch arranged to limit a DC current flow when the output signal is in a high state or a low state.

Optionally, the resonant circuit comprises an inductor and a capacitor. The capacitor may be a programmable capacitor.

Optionally, the filter circuit comprises a first stage arranged to modify the frequency spectrum of the input signal in the derivation of the output signal; and a second stage arranged to provide a driving gain sufficient to switch the transistor from a first state to a second state.

Optionally, the first stage comprises the resonant circuit mentioned above.

Optionally, the input signal is a digital control signal.

Optionally, the frequency band is a frequency region where an overshoot, an undershoot or an oscillatory waveform is generated during operation.

According to a second aspect of the disclosure there is provided a DC-DC converter comprising at least one transistor and at least one gate drive circuit associated with the pass transistor; said gate drive circuit arranged to receive an input signal and provide an output signal to drive a gate of the transistor, wherein the output signal is derived from the input signal; and comprising a filter circuit arranged to attenuate a frequency band from the input signal when deriving the output signal from the input signal.

The second aspect may share features of the first aspect, as noted above and herein. Furthermore, gate devices according to the disclosure may also be provided with other devices such as an analog-digital converter or a digital-to-analog converter.

According to a third aspect of the disclosure there is provided a method of driving a gate of a transistor, comprising receiving an input signal and deriving an output signal from said input signal; and wherein said deriving an output signal comprises attenuating a frequency band from the input signal.

The third aspect may share features of the first and second aspects, as noted above and herein.

BRIEF DESCRIPTION OF THE DRAWINGS

The invention is described in further detail below by way of example and with reference to the accompanying drawings, in which.

DESCRIPTION

Figure 1:
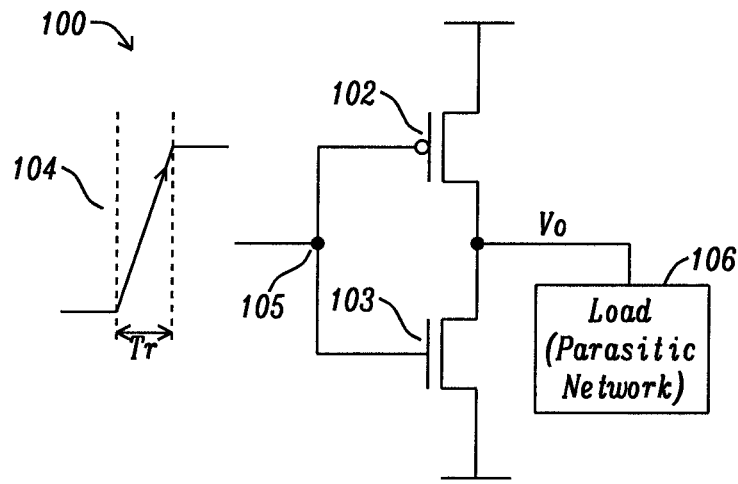
FIG. 1 shows a digital CMOS invertor driven by a unit-step signal.

FIG. 1 shows a digital CMOS inverter 100, comprising a pair of transistors 102/103. The digital CMOS inverter 100 is driven by an input signal which is a unit-step signal 104 with a transition time, Tr. The digital CMOS inverter 100 receives the input signal at an input node 105. The digital CMOS inverter 100 outputs an output signal Vo at an output node. The output node is coupled to a load 106 which comprises a parasitic network. The parasitic network comprises parasitic resistors, parasitic inductors and parasitic capacitors. During the transition time, Tr, the transistors are driven through a cutoff region, a saturation region, and a triode region, or vice versa. A transconductance (gm) of the transistors also varies.

When the transistors are in the saturation region the digital CMOS inverter operates as a CMOS amplifier. During the time period in which the transistors are in the saturation region, the input signal 104 can be amplified and the spectrum of the input signal 104 can also be altered. An overshoot, an undershoot, or an oscillatory waveform are generated if the spectrum of the output signal Vo presents sufficient intensity in the bandwidth of the parasitic network 106.

Figure 2:
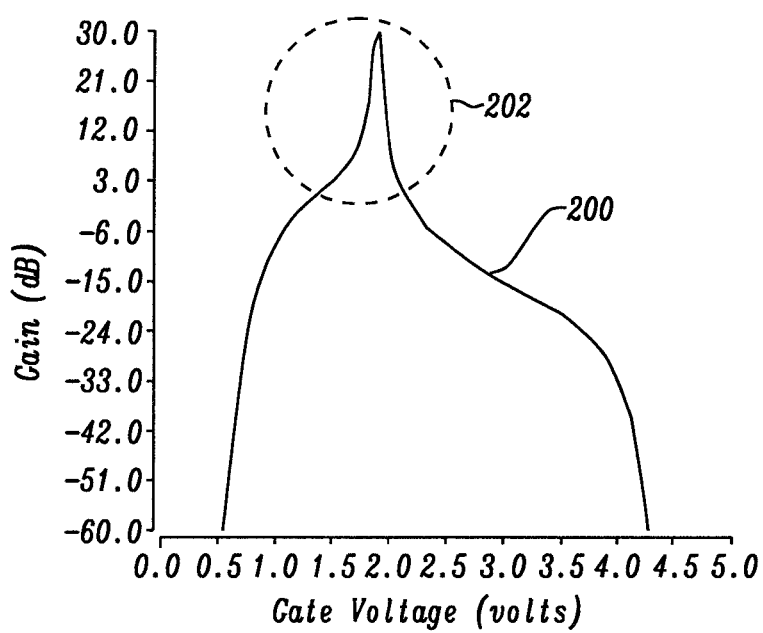
FIG. 2 shows gain variations of the CMOS inverter during transition.

FIG. 2 shows a gain response 200 versus a gate voltage at the input node 105 of the digital CMOS inverter 100. There is a linear gain when the transistors 102 are in the saturation region 202.

Figure 3:
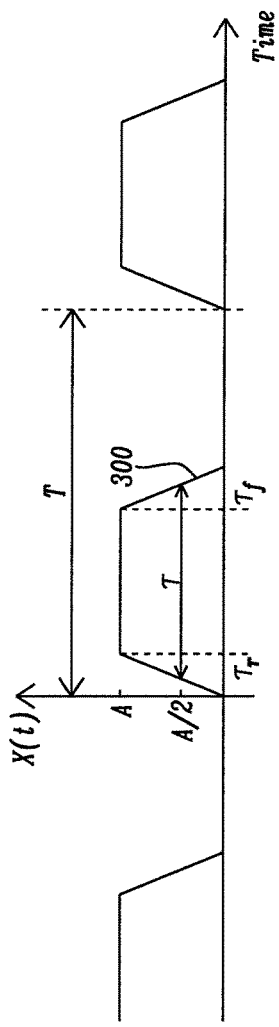
FIG. 3 shows a periodic digital signal with a trapezoidal waveform in the time domain.

FIG. 3 shows a periodic digital signal with a trapezoidal waveform 300 in the time domain. The trapezoidal waveform 300 has a period T, a pulse width $\tau$, a rise time $\tau_r$, a fall time $\tau_f$, and an amplitude A. The rise time $\tau_r$ is the time taken to transition from a low state to a high state. The fall time $\tau_f$ is the time taken to transition from a high state to a low state. To simplify the analysis which follows, it is assumed that the rise time $\tau_r$ and the fall time are $\tau_f$ equal though it will be appreciated that there may be circumstances in which they are not, and the disclosure applies equally in those circumstances.

Figure 4:
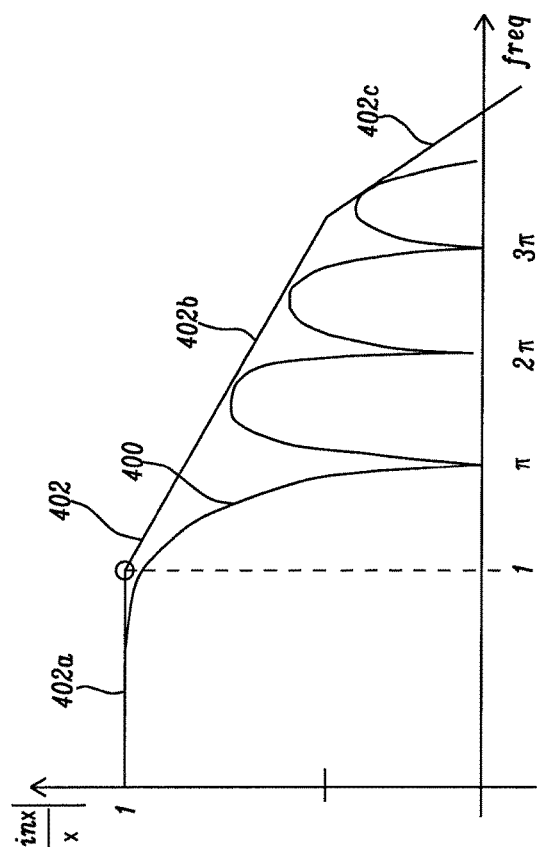
FIG. 4 shows an illustrative trapezoidal waveform in the frequency domain with spectral envelopes and spectral bounds.
Figure 5:
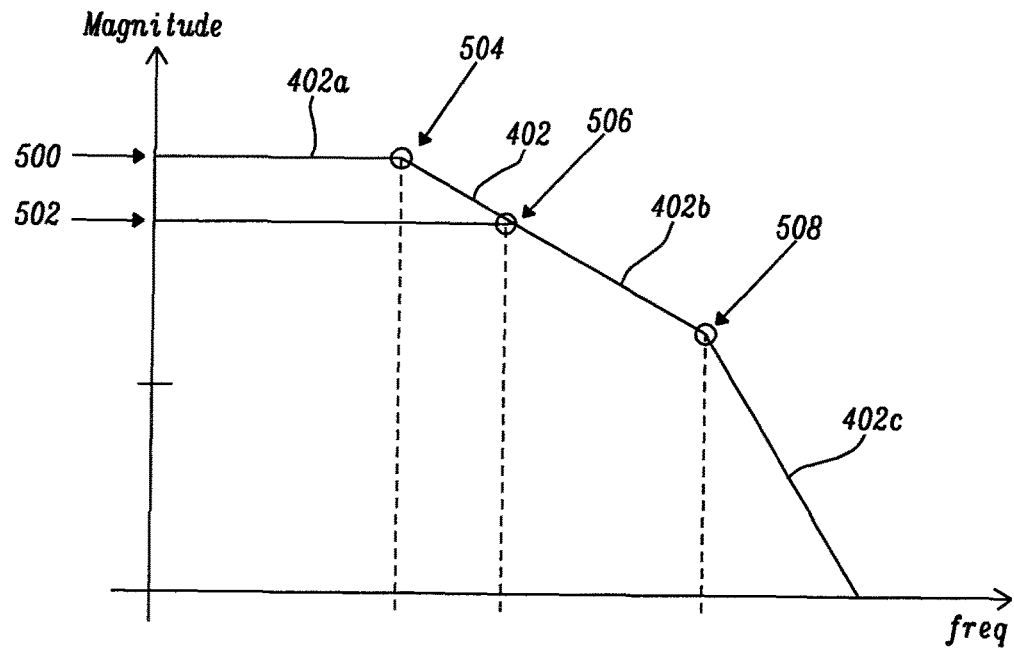
FIG. 5 shows an illustrative trapezoidal waveform in the frequency domain with spectral bounds.
Figure 6:
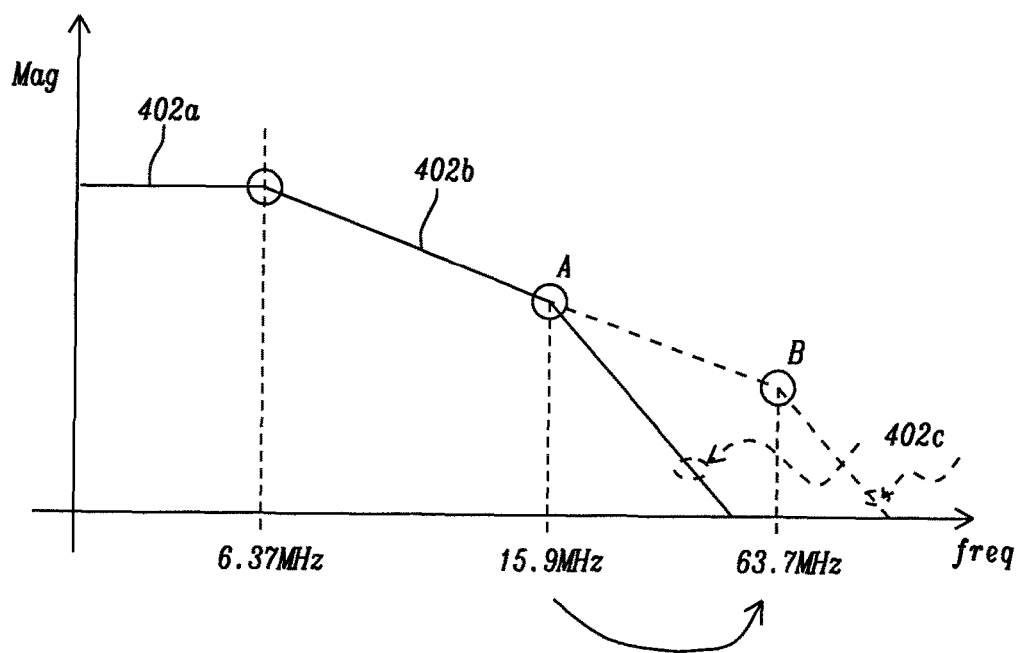
FIG. 6 shows an illustrative trapezoidal waveform in the frequency domain with spectral bounds for different rise/fall transition times.

The trapezoidal waveform can be transformed to its spectral components in the frequency domain. Illustrative trapezoidal waveforms are shown in FIGS. 4 through 6. FIG. 4 illustrates the frequency domain with spectral envelopes and spectral bounds, FIG. 5 illustrates the frequency domain with spectral bounds, and FIG. 6 illustrates the frequency domain with spectral bounds for different rise/fall transition times.

The coefficients for the spectral components can be expressed by:

$$C_n = A \frac{\tau}{T} \frac{\sin\left(\frac{1}{2}n\omega_0\tau\right)}{\frac{1}{2}n\omega_0\tau} \frac{\sin\left(\frac{1}{2}n\omega_0\tau_r\right)}{\frac{1}{2}n\omega_0\tau_r} e^{-\frac{jn\omega_0(\tau+\tau_r)}{2}}$$

where n is an integer and $\omega_0$ is an angular frequency of the trapezoidal waveform. An envelope 400 of these spectral components follows a form of $$\frac{\sin(\pi f t)}{\pi f t}$$

and has zeros at $$f = \frac{m}{\tau}$$

for m=1, 2, 3, . . . , where t is time. The envelope 400 can be bounded by spectral bound 402 as shown in FIG. 4 and FIG. 5, and the corresponding equations are as follows:

Envelope=$2A\tau/T|\sin(\pi\tau f)/\pi\tau f||\sin(\pi\tau_r f)/(\pi\tau_r f)|$ $$\left|\frac{\sin x}{x}\right| \le 1 \text{ for small}^x$$

$$\left|\frac{\sin x}{x}\right| \le \frac{1}{x} \text{ for large}^x$$

where x=$\pi\tau f$.

The spectral bound 402 has a slope of 0 dB/Dec at 402a, −20 dB/Dec at 402b and −40 dB/Dec at 402c. The magnitude of the 0 dB/Dec slope 402a varies with a duty cycle of the trapezoidal waveform, where the duty cycle D=τ/T. For a first duty cycle D1, the slope has a first magnitude 500 and for a second duty cycle D2, the slope has a second magnitude 502, where D1>D2. The first magnitude 500 is equal to 2AD1 and the second magnitude 502 is equal to 2AD2, where A is the amplitude of the trapezoidal waveform as defined previously.

A break point marks a frequency at which the slope transitions from a first roll-off value to a second roll-off value, where roll-off values have units of dB/Dec. A first break point is where the slope transitions from 0 dB/Dec to −20 dB/Dec for the duty cycle D. The first break point is at a point 504 when the duty cycle D is equal to a first duty cycle D1. The point 504 occurs at a frequency equal to $$\frac{f_0}{\pi D1},$$

where $f_0$ is the frequency of the trapezoidal waveform. The first break point is at a different point 506 when the duty cycle D is equal to a second duty cycle D2. The point 506 occurs at a frequency equal to $$\frac{f_0}{\pi D2}.$$

A second break point 508 is where the slope transitions from −20 dB/Dec to −40 dB/Dec. The second break point 508 is at a frequency equal to $$\frac{1}{\pi \tau_r}.$$

The pulse width, τ determines a location of the first break point 504, 506 for the 0 dB/Dec to −20 dB/Dec slope transition. The rise time $\tau_r$ and the fall time $\tau_f$ determines the second break point 508 for the −20 dB/Dec to −40 dB/Dec slope transition. When the trapezoidal waveform has a steep transition slope, corresponding to a short transition time and small rise time $\tau_r$, the second break point 508 will be at a high frequency. Therefore, the magnitude of the high frequency spectrum before the second break point 508 will be high. An oscillatory waveform will be generated if the spectrum of the digital signal is enhanced by a digital circuit, such as the CMOS inverter 100 of FIG. 1, at the bandwidth of parasitic inductor/capacitor LC elements, such as the parasitic network 106 of FIG. 1.

FIG. 6 shows the spectral bounds and second break point for different rise times and fall times. For a first rise time $\tau_{r1}$ and a first fall time $\tau_{f1}$, where the rise and fall times are both equal to 20 ns, the second break point is at a point A. For a second rise time $\tau_{r2}$ and a second fall time $\tau_{f2}$, where the rise and fall times are both equal to 5 ns, the second break point is at a point B.

Figure 7:
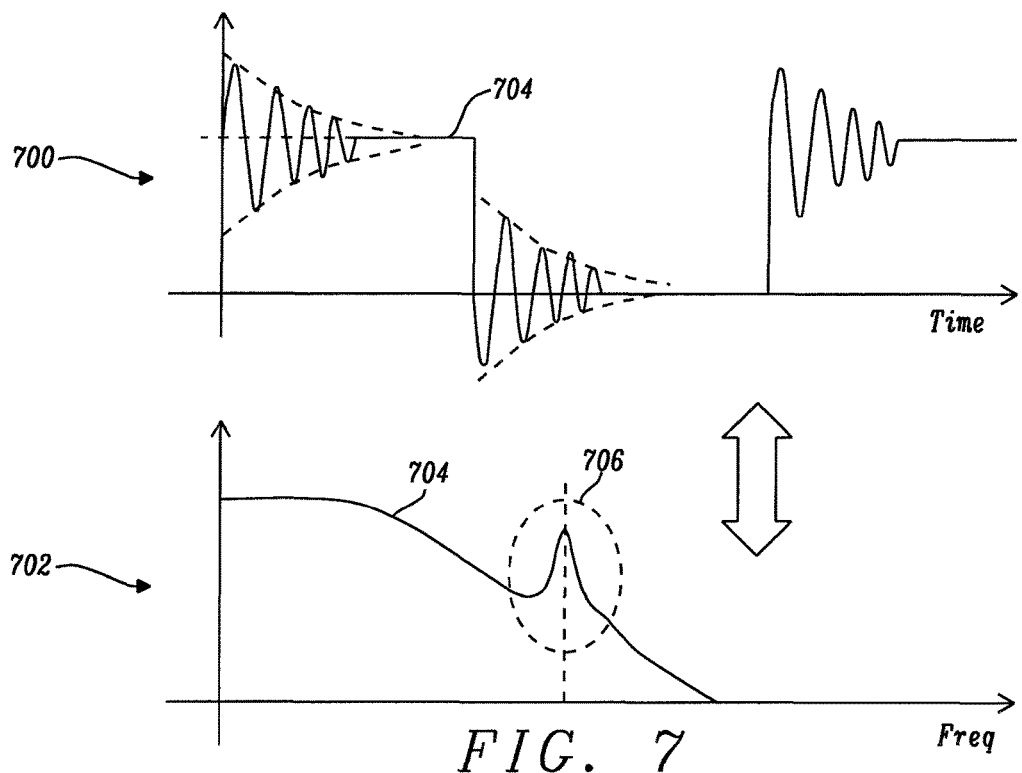
FIG. 7 shows an oscillatory waveform in the time domain and in the frequency domain.

FIG. 7 shows an oscillatory waveform 704 in the time domain 700 and in the frequency domain 702. A bandwidth of the signal spectrum is higher for steeper transition slopes of the digital signal. It is likely that along the circuit path of the digital signal, the high frequency spectrum of the signal will be boosted during the transition as shown at 706 in FIG. 7.

Gate driving circuits that output a gate driving signal with fast transitions potentially cause voltage/current spikes and in turn show high switching noise and electromagnetic interference (EMI). High switching noise may alternatively be referred to as ringing or an oscillatory waveform. On the other hand, slow transitions produce higher power loss and thus reduce power efficiency of devices comprising gate driving circuits, such as switching converters.

A known method to control the transition slopes of the gate driving signal uses an increased gate resistance scheme. A first implementation uses two resistors at a gate of a pass transistor to control the charging current. The resistors are for the turn-on and turn-off switching processes of the pass transistor. A tunable current source is used to adjust the transition slope of the gate driving signal. A second implementation uses a push-pull stage with a gate resistor to drive the pass transistor. There is a feedback path operating as a derivative circuit to detect a transition. Detection of the transition and correction operations are too slow to be practical for a low power system. The ringing is not reduced by either of the above two implementations.

Another known method employs active gate signalling methods, where the gate driving signals are generated with a two-step gate control voltage or a three-step gate control voltage during a rising or a falling transition. The two-step circuit uses two contention drivers and a small resistor to generate a two-step voltage during a transition time. As the first voltage step is limited, an overshoot/undershoot of the pass transistor can be reduced if the transition time is sufficiently long. However, this results in a transition time that is too long to be practical for most applications. In most low-power portable communication devices the transition time is typically limited to a few nanoseconds, such that a delay time becomes comparable to the transition time. Due to the long delay, the correcting feedback signal could fall into the dead-time intervals and the gate-drive control becomes problematic. The delay time comprises the total propagation delay of the signal path driving the pass transistors; a circuit response-time, corresponding to the required rise and fall times of the gate driving circuits; and a non-overlapping time, corresponding to a dead time. The two-step circuit uses a feedback path which requires digital timing to enclose a control-loop. It is not possible to reduce the ringing using the two-step circuit. It will be appreciated that the three-step circuit also will exhibit similar shortcomings.

A further known method uses a Gaussian Waveform generator to produce a Gaussian gate driving signal to provide smoother transitions between a first logic state and a second logic state. This method requires complex control-loops for generating the Gaussian gate driving signal which leads to high cost in implementation and is not realistic in product development.

The prior methods employ time-domain concepts to adjust the transition slopes of the gate driving signal. As most low-power converters come with short transition times (i.e. within 10 nanoseconds), it is challenging to evaluate and optimise the transition slope in a practically implementable gate drive circuit.

Figure 8:
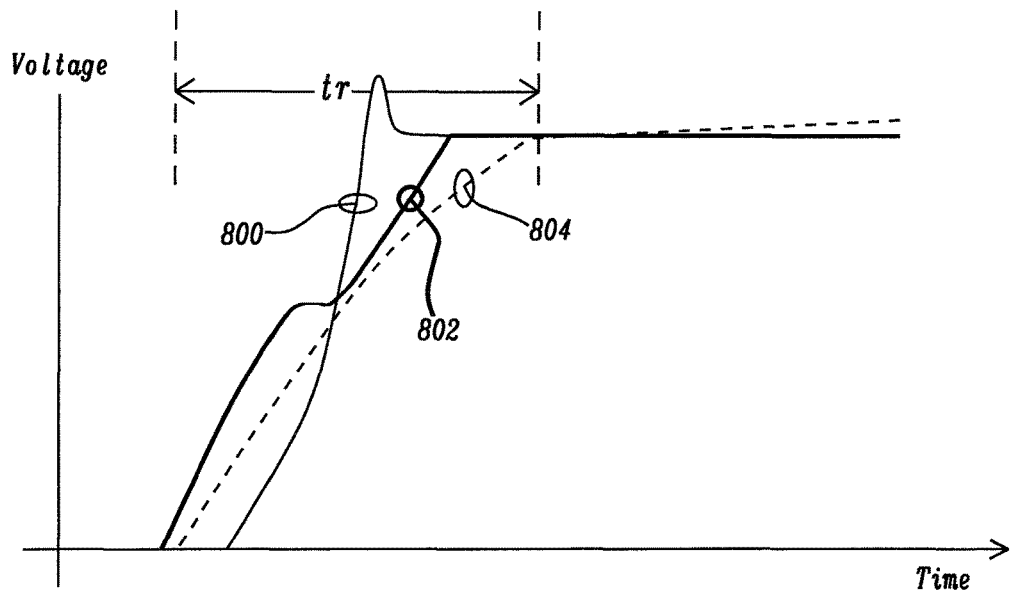
FIG. 8 shows prior art time domain approaches for adjusting a transition slope.

FIG. 8 shows a comparison of time-domain approaches for adjusting the transition slopes. It can be observed that optimisation of the transition slopes can become challenging when a transition time tr is short, due to the impacts of parasitic elements 800, resulting in an overshoot as described above; signal distortions 802; and non-linearity 804.

This disclosure describes a technique which uses frequency spectrum manipulations in the frequency domain to enhance device efficiency, by shortening the transition time of gate driving signals received by pass transistors, and to provide an optimised transition slope, to prevent undesirable switching noise and EMI.

The following discussion concerns application of the technique to gate driving circuits for switching converters, however it will be appreciated that this is just one exemplary type of device to which the disclosure can be applied.

Figure 9:
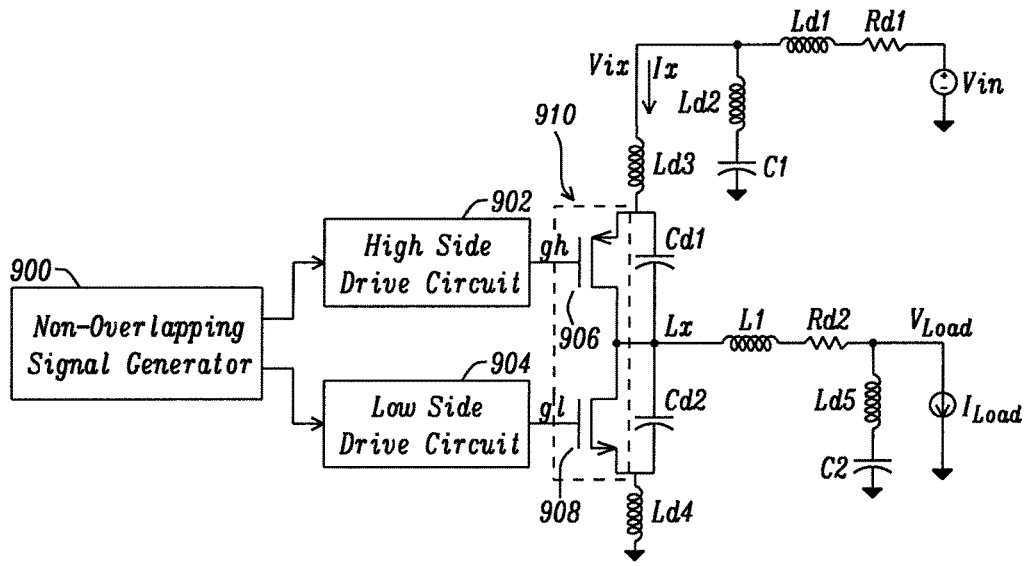
FIG. 9 shows a buck converter with complementary pass transistors.

FIG. 9 shows a switching converter, in the form of a complementary pass-transistor buck converter that receives an input voltage Vin and outputs a regulated output voltage $V_{Load}$ with a load current $I_{Load}$. A non-overlapping signal generator 900 has a first output coupled to an input of a high side gate drive circuit 902 and a second output coupled to an input of a low side gate drive circuit 904. The high side gate drive circuit 902 has an output coupled to a gate of the high side pass transistor 906. The low side gate drive circuit 904 has an output coupled to a gate of the low side pass transistor 908. The pass transistors are complementary pass transistors 910 such that the high side pass transistor 906, is a p-type transistor and the low side pass transistor 908, is an n-type transistor. The gate of the high side pass transistor 906 receives a high side gate voltage gh from the output of the high side gate drive circuit 902, and the gate of the low side pass transistor 908 receives a low side gate voltage gl from the output of the low side gate drive circuit 904.

A drain of the high side pass transistor 906 is coupled to a drain of the low side pass transistor 908 via an inductor node Lx. A source of the low side pass transistor 908 is coupled to ground. A first capacitor C1 has a first terminal coupled to a source of the high side pass transistor 906 and a voltage source at an input voltage port Vix with a current Ix. The voltage source provides the input voltage Vin. The first capacitor C1 has a second terminal coupled to ground.

The inductor node Lx is coupled to a first terminal of a first inductor L1 which has a second terminal coupled to a first terminal of a second capacitor C2. A second terminal of the second capacitor C2 is coupled to ground. The second terminal of the inductor is at the output voltage $V_{Load}$ and the load current $I_{Load}$.

The buck converter comprises a plurality of parasitic elements. The parasitic elements comprise parasitic capacitances, represented by capacitor symbols; parasitic inductances, represented by inductor symbols; and parasitic resistances, represented by resistor symbols. A first parasitic resistance Rd1, a first parasitic inductance Ld1 and a third parasitic inductance Ld3 are connected in series between the voltage source and the source of the high side pass transistor 906. The first parasitic resistance Rd1, the first parasitic inductance Ld1 and a second parasitic inductance Ld2 are connected in series between the voltage source and the first terminal of the first capacitor C1. A first parasitic capacitance Cd1 is connected in parallel with the high side pass transistor 906 at its drain and source. A second parasitic capacitance Cd2 is connected in parallel with the low side pass transistor 908 at its drain and source. A fourth parasitic inductance Ld4 is connected between the source of the low side pass transistor 908 and ground. A second parasitic resistance Rd2 and fifth parasitic inductance Ld5 are connected in series between the second terminal of the first inductor L1 and the first terminal of the second capacitor C2.

An oscillatory waveform can be generated at the input voltage port Vix or the inductor node Lx if the outputs of the gate drive circuits gh, gl include a frequency band of sufficient intensity within the bandwidth of the parasitic elements.

Figure 10:
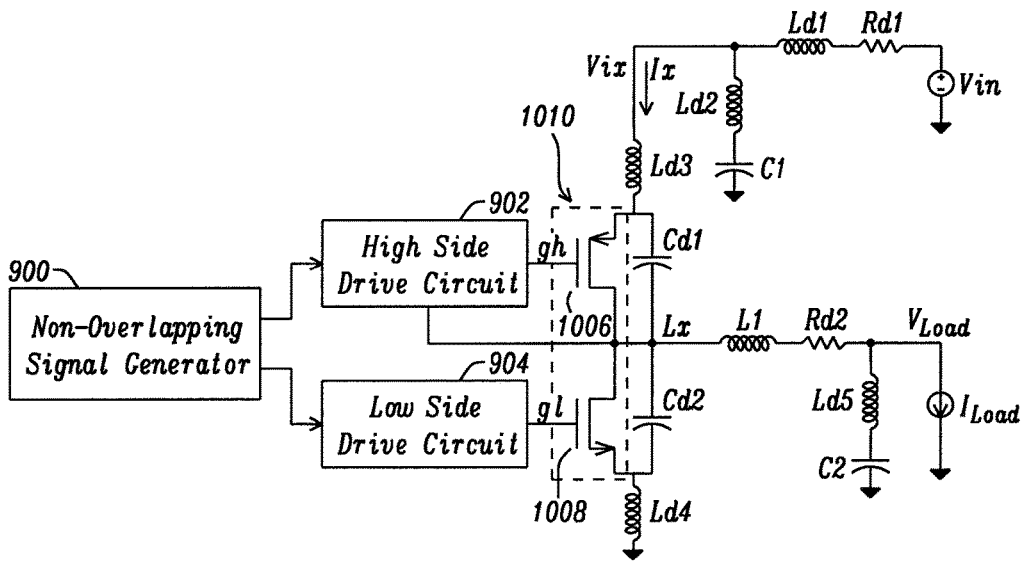
FIG. 10 shows a buck converter with dual n-type pass transistors.

FIG. 10 shows a switching converter, in the form of a dual n-type pass-transistor buck converter that receives an input voltage Vin and outputs a regulated output voltage $V_{Load}$ with a load current $I_{Load}$. The circuit of FIG. 10 is as described for FIG. 9, however in FIG. 10 the complementary pass transistors 910 as shown in FIG. 9 are replaced by dual n-type transistors 1010, in which both a high side pass transistor 1006 and a low side pass transistor 1008 are n-type transistors. The inductor node Lx is also coupled to the high side gate drive circuit 902.

Figure 11:
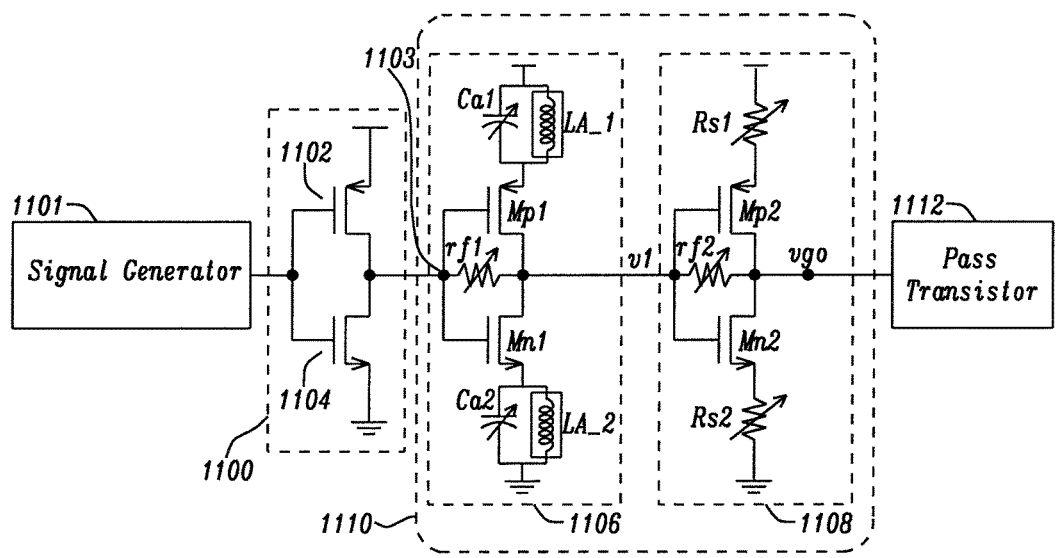
FIG. 11 shows a gate drive circuit in accordance with an embodiment of this disclosure.

FIG. 11 shows a system including an embodiment of a gate drive circuit 1110 in accordance with the disclosure. This is an embodiment of a circuit that could be used as the high side gate drive circuit 902 and the low side gate drive circuit 904 as shown in FIG. 9 and FIG. 10. A signal generator 1101 is coupled to an input of the gate drive circuit 1110 via an optional buffer circuit 1100. The signal generator 1101 provides a digital input signal to the gate drive circuit 1110. The buffer circuit 1100 in this example comprises a p-type transistor 1102 with a drain coupled to a drain of an n-type transistor 1104 via a buffer output node that provides an output of the buffer circuit 1100. A source of the n-type transistor 1104 is coupled to ground. A source of the p-type transistor 1102 is coupled to a power rail. The output of the signal generator 1101 is coupled to a buffer input node which is coupled to a gate of the p-type transistor 1102 and a gate of the n-type transistor 1104. The buffer output node is coupled to a first stage input node 1103.

The gate drive circuit 1110 comprises a first stage 1106 and a second stage 1108. The first stage 1106 comprises a programmable band stop filter, to filter potentially oscillatory frequencies; and further comprises a means to adjust a low-frequency gain and bandwidth of the gate drive circuit 1110. The second stage 1108 comprises a means to ensure that there is sufficient driving capacity to drive a pass transistor 1112; and further comprises a means to adjust a high frequency gain response of the gate drive circuit 1110.

The first stage 1106 comprises a first tunable capacitor Ca1 with a first terminal coupled to a first terminal of a first gate driver inductor LA_1. A second terminal of the first tunable capacitor Ca1 is coupled to a second terminal of the first gate driver inductor LA_1. The first terminals of the first tunable capacitor Ca1 and the first gate driver inductor LA_1 are coupled to the power rail. The second terminals of the first tunable capacitor Ca1 and the first gate driver inductor LA_1 are coupled to a source of a first p-type transistor Mp1. A drain of the first p-type transistor Mp1 is coupled to a drain of a first n-type transistor Mn1 via a first stage output node.

A source of the first n-type transistor Mn1 is coupled to a first terminal of a second tunable capacitor Ca2 and a first terminal of a second gate driver inductor LA_2. A second terminal of the second tunable capacitor Ca2 and a second terminal of the second gate driver inductor LA_2 are coupled to ground.

The first gate driver inductor LA_1 and the second gate driver inductor LA_2 can be made using on-chip spiral inductors. The gate driver inductors may be implemented as active inductors The first stage input node is coupled a first terminal of a first feedback resistor rf1, a gate of the first p-type transistor Mp1 and a gate of the first n-type transistor Mn1. A second terminal of the first feedback resistor rf1 is coupled to the first stage output node.

The first stage output node is coupled to a second stage input node. The second stage input node is coupled to a first terminal of a second feedback resistor rf2, a gate of a second p-type transistor Mp2 and a gate of a second n-type transistor Mn2. A drain of the second p-type transistor Mp2 is coupled to a drain of the second n-type transistor Mn2 via a second stage output node. The second stage output node is an output of the gate drive circuit 1110.

A first tunable resistor Rs1 has a first terminal coupled to the power rail and has a second terminal coupled to a source of the second p-type transistor Mp2. A second tunable resistor Rs2 has a first terminal coupled to a source of the second n-type transistor Mn2 and has a second terminal coupled to ground. The second stage output node is coupled to the pass transistor 1112. The second stage output node outputs a gate driving voltage vgo to the pass transistor 1112. The pass transistor 1112 may be the high side pass transistor 906, 1006 or the low side pass transistors 908, 1008 as shown in FIG. 9 and FIG. 10.

The band-stop filtering circuitry may in preferred embodiments be programmable. One way of achieving this is to provide a tunable resonant circuit, and the gate drive circuit 1110 of FIG. 11 shows one example of such a tunable resonant circuit. Here, a first stage 1106 comprises a low-Q LC resonant circuit to produce a frequency-selective impedance in a specified frequency region. The frequency-selective impedance results in a minimum gain of a transfer-function at the specified frequency region, which provides band-stop filtering for switching noise or oscillatory frequencies. The tunable capacitors Ca1, Ca2 are used to adjust the specified frequency region at which band-stop filtering occurs.

The first feedback resistor rf1 may be a variable resistor and can be tuned to adjust the low-frequency gain and bandwidth of the gate drive circuit 1110.

The second stage 1108 uses larger device sizes than the first stage 1106 to ensure that there is a sufficient driving capacity to drive the pass transistor 1112. The tunable resistors Rs1, Rs2 are variable resistors and are used to determine a driving gain of the gate drive circuit 1110. The second feedback resistor rf2 is a variable resistor and can be tuned to adjust the high frequency gain response of the gate drive circuit 1110. This can be used to reduce the transition time of the gate driving signals.

Figure 12:
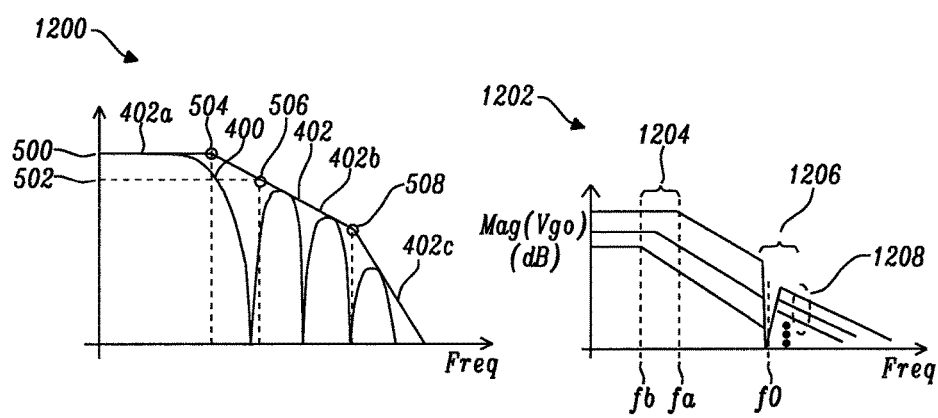
FIG. 12 shows the trapezoidal waveform in the frequency domain with spectral envelopes and spectral bounds, and a gain-frequency plot showing the gain-shaping characteristics of the gate drive circuit embodiment shown in FIG. 11.

FIG. 12 shows the trapezoidal waveform in the frequency domain 1200 as was described for FIG. 3, FIG. 4 and FIG. 5, together with a gain-frequency plot 1202 of the gate drive circuit 1110. The gain shaping characteristics and band-stop filtering of the gate drive circuit 1110 are shown in the gain-frequency plot 1202.

A low frequency gain and bandwidth tuning region 1204, a band-stop region 1206 and high frequency gain tuning region 1208 are shown on the gain-frequency plot 1202. A frequency fb, a frequency fa and a frequency f0 are shown on the gain-frequency plot 1202. The frequency f0 is the centre frequency of the band-stop region 1206. The frequency fb indicates the bandwidth of the gate drive circuit 1110 for a low driving gain condition, and the frequency fa indicates the bandwidth of the gate drive circuit 1110 for a high driving gain condition.

The low frequency gain and bandwidth region 1204 may be adjusted as described above to achieve an optimal gate driving signal with an optimum low-pass response. Generally speaking, a smaller low frequency gain and bandwidth will result in a longer rise time $\tau_r$ and a longer fall time $\tau_f$, which will move the second break point 508 to a lower frequency. Increasing the gain at the high frequency gain region 1208 will usually result in a faster transition speed, corresponding to a shorter rise time $\tau_r$ and a shorter fall time $\tau_f$. Adjusting the high frequency gain region 1208 is adjustment of the high-pass response.

Figure 13:
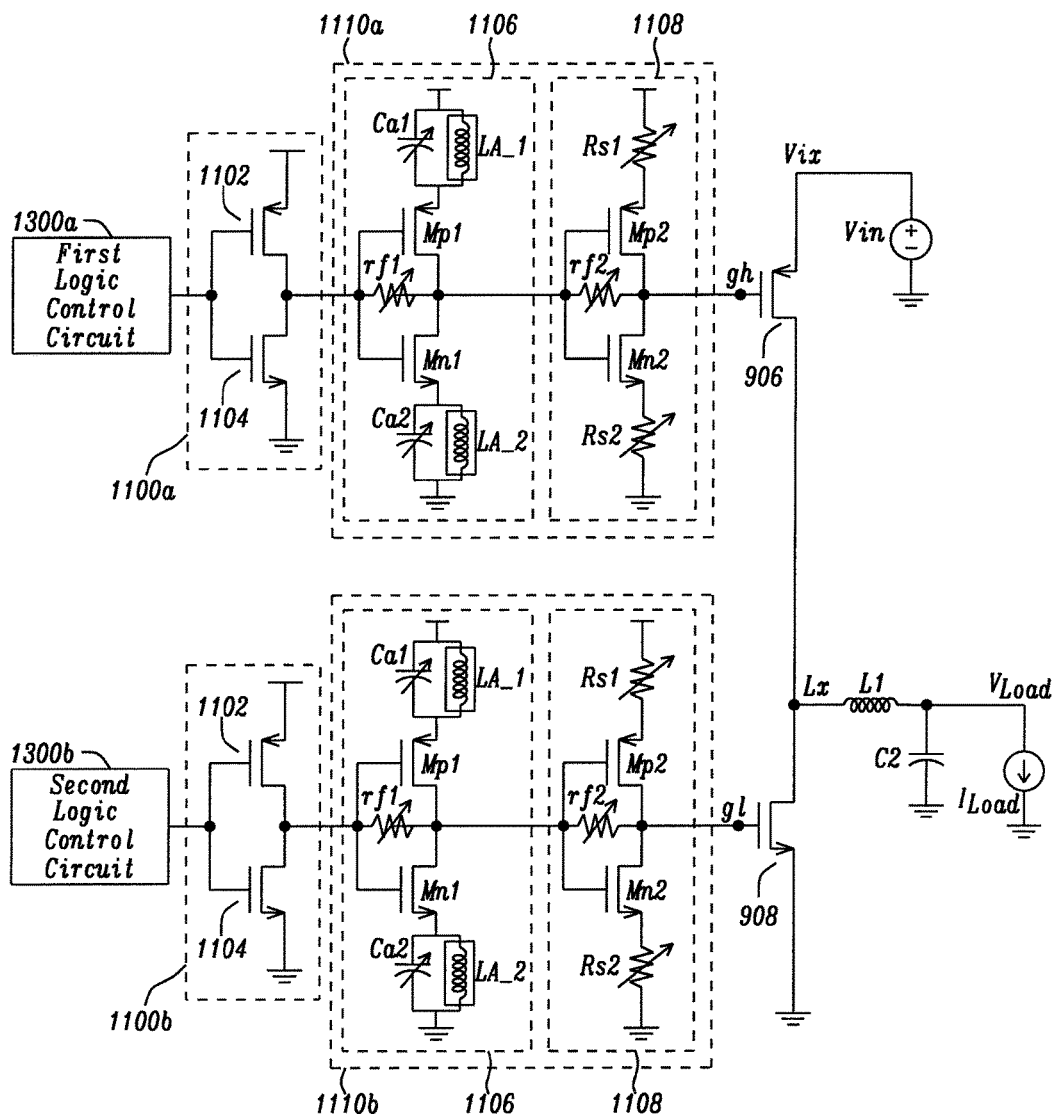
FIG. 13 shows an embodiment of a buck converter comprising two gate drive circuits, where the gate drive circuits correspond to the embodiment shown in FIG. 11.

FIG. 13 shows the buffer circuit 1100 and gate drive circuit 1110 of FIG. 11 implemented in a buck converter. A first gate drive circuit 1110a, equivalent to the gate drive circuit 1110, is used to drive the high side pass transistor 906. A second gate drive circuit 1110b, equivalent to the gate drive circuit 1110, is used to drive the low side pass transistor 908. An output of the first gate drive circuit 1110a is coupled to a gate of the high side pass transistor 906 and an output of the second gate drive circuit 1110b is coupled to a gate of the low side pass transistor 908.

A first buffer 1100a, equivalent to the buffer circuit 1100, is coupled to a first logic control circuit 1300a. A second buffer 1100b, equivalent to the buffer circuit 1100, is coupled to a second logic control circuit 1300b. The buck converter is as described in FIG. 9 (the first capacitor C1 is an external component, shown in FIG. 9 to illustrate its parasitic inductance, so is not shown here)

The gate drive circuits 1110a, 1110b can provide optimal transition behaviours of the pass transistors 906, 908. The band stop filtering circuitry can pre-attenuate a frequency band that has the potential to cause ringing (overshoot or undershoot) at the input voltage port Vix or the inductor node Lx, before the frequency band is coupled to the parasitic elements of the buck converter. The inductor node Lx may be a PMIC output port. The low pass response, the high pass response and the programmable band stop filtering circuitry have independent programmability in their transfer-functions.

To reduce DC power consumption, each of the feedback resistors rf1, rf2 comprise a current-blocking switch which is turned off to limit DC current flow at the end of a transition.

This disclosure provides a frequency domain technique for gate drive circuits and optimises the break points for best performance between power efficiency and switching noise. The gate drive circuit may employ this frequency domain technique to pre-attenuate a potential oscillatory frequency range and to allocate the second break point through manipulations between the low pass response and the high pass response.

The disclosed technique can be applied to many other applications for digital glitch control such as DC-DC converters, high resolution data converters (analog-to-digital or digital-to-analog converters), and feedback stability control for ringing reductions.

The gate drive circuit using the frequency domain technique comprises programmable passive devices forming a band stop filter in both a high side and a low side drive switch paths. The gate drive circuit using the frequency domain technique further comprises the first stage and the second stage with a programmable dead time. The first stage provides a frequency spectral control and the second stage provides a drive strength control.

Figure 14:
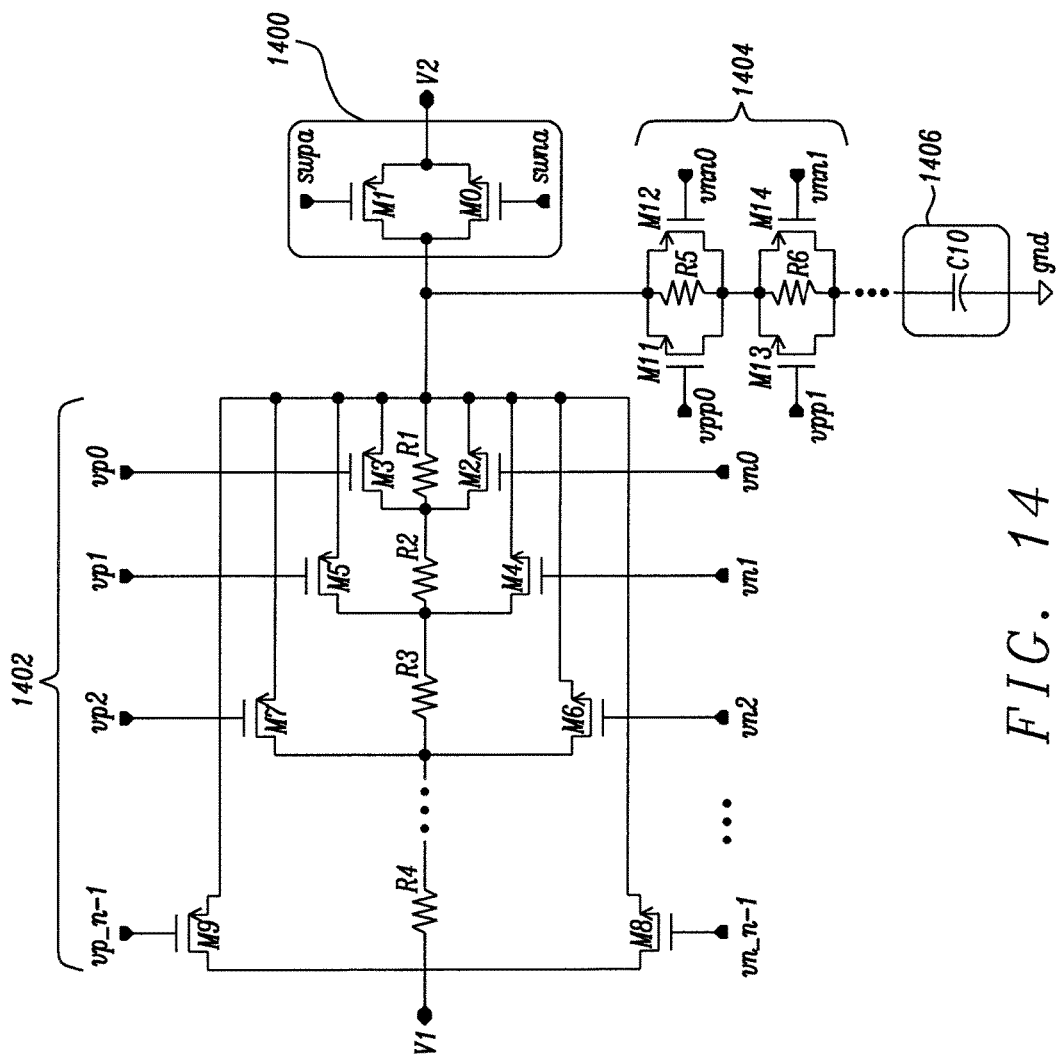
FIG. 14 shows an embodiment of a feedback resistor which comprises a current blocking switch.

FIG. 14 shows an embodiment of the feedback resistors rf1, rf2 and a current-blocking switch 1400. The feedback resistors rf1, rf2 comprise a resistor network which comprises a series resistor string 1402 and a shunt resistor string 1404. The series resistor string 1402 and the shunt resistor string 1404 each comprise a plurality of transmission gates coupled with resistors to provide programmable feedback resistance controls. The resistance of the feedback resistors rf1, rf2 can be controlled by an N-bit digital signal bus in a thermometer code scheme. The current-blocking switch 1400 is implemented using a transmission gate. In operation, the current is blocked when the gate drive circuit 1110 completes a transition.

A capacitor 1406 is coupled to the shunt resistor string 1404 at a first terminal and has a second terminal coupled to ground. In operation, the capacitor 1406 provides a current divider function during the transition, but limits the current flowing after the gate drive circuit 1110 reaches steady state. The current divider can reduce the transition slopes on the output of the gate drive circuit 1110.

Figure 15:
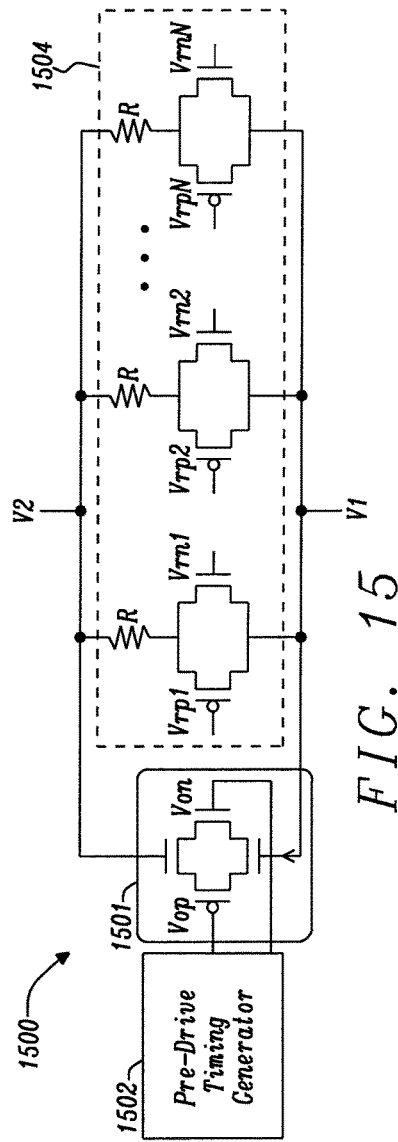
FIG. 15 shows an embodiment of a tunable resistor.

FIG. 15 shows an embodiment of the tunable resistors Rs1, Rs2. The tunable resistors Rs1, Rs2 comprise a pre-drive switch 1501 that is coupled to a pre-drive timing generator 1502. The pre-drive timing generator 1502 acts as a pulse-width control circuit for the pre-drive switch 1501. The tunable resistors Rs1, Rs2 further comprise a programmable resistor string 1504 comprising a plurality of resistors R and a plurality of transmission gates. Each resistor R is connected in series with a transmission gate to form a resistor element. The resistor elements are connected in parallel with each other and with the pre-drive switch 1501. The programmable resistor string may be programmed as described in FIG. 14 for the series and shunt resistor strings 1402, 1404.

Figure 16:
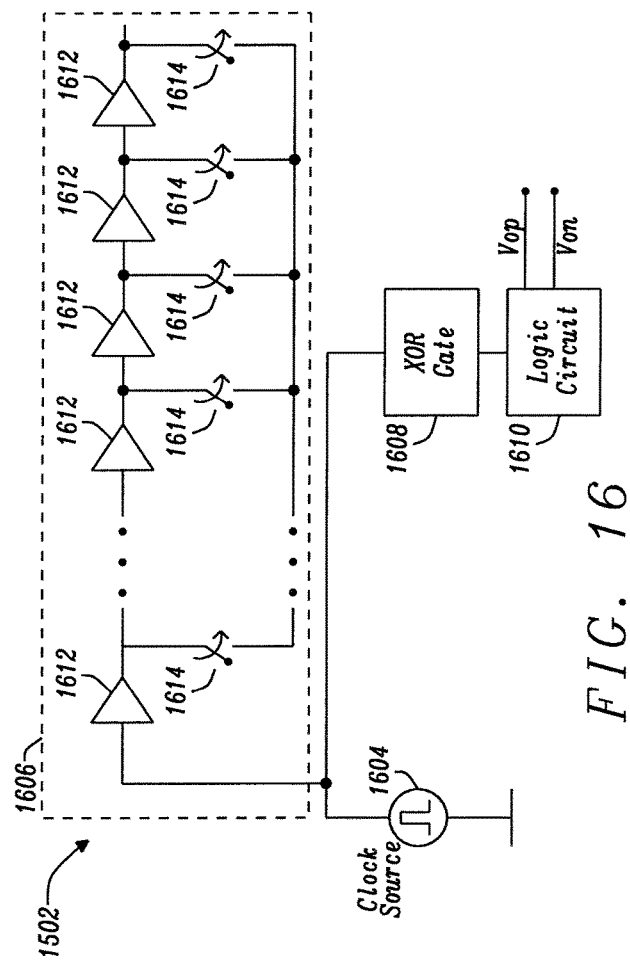
FIG. 16 shows an embodiment of a pre-drive timing generator as used in the tunable resistor embodiment shown in FIG. 15

FIG. 16 shows an embodiment of the pre-drive timing generator 1502. The pre-drive timing generator 1502 comprises a clock source 1604, a delay cell 1606, a XOR gate 1608 and a logic circuit 1610. The clock source 1604 is coupled to a first input of the XOR gate 1608.

The delay cell comprises a plurality of buffers 1612. A first buffer receives an input from the clock source 1604. Each subsequent buffer receives an input from an output of a preceding buffer. The delay cell 1606 further comprises a plurality of switches 1614. The output of each buffer is coupled to a first terminal of an associated switch. A second terminal of each switch 1614 is coupled to a common node which is coupled to a second input of the XOR gate 1608. An output of the XOR gate is coupled to the logic circuit 1610. The logic circuit provides a first output voltage Vop, and a second output voltage Von which are received by the pre-drive switch 1501 as shown in FIG. 15.

In operation, when the pre-drive switch 1501 is turned on a full-strength of the output of the gate drive circuit 1110 is passed to the associated pass transistor within a short period of time, thereby minimising a delayed response time of the pass transistors. This is beneficial for an effective control-loop of buck converters in peak/valley current detections and corrections when the programmable dead time of the gate drive circuit 1110 requires optimisation.

The variable resistors Rs1, Rs2 also provide a programmable source-degeneration resistance to the transistors of the second stage 1108 for an adequate driving gain, which supports an optimised transition. The resistor network can also be used for power voltage temperature (PVT) tracking and variation reductions.

Figure 17:
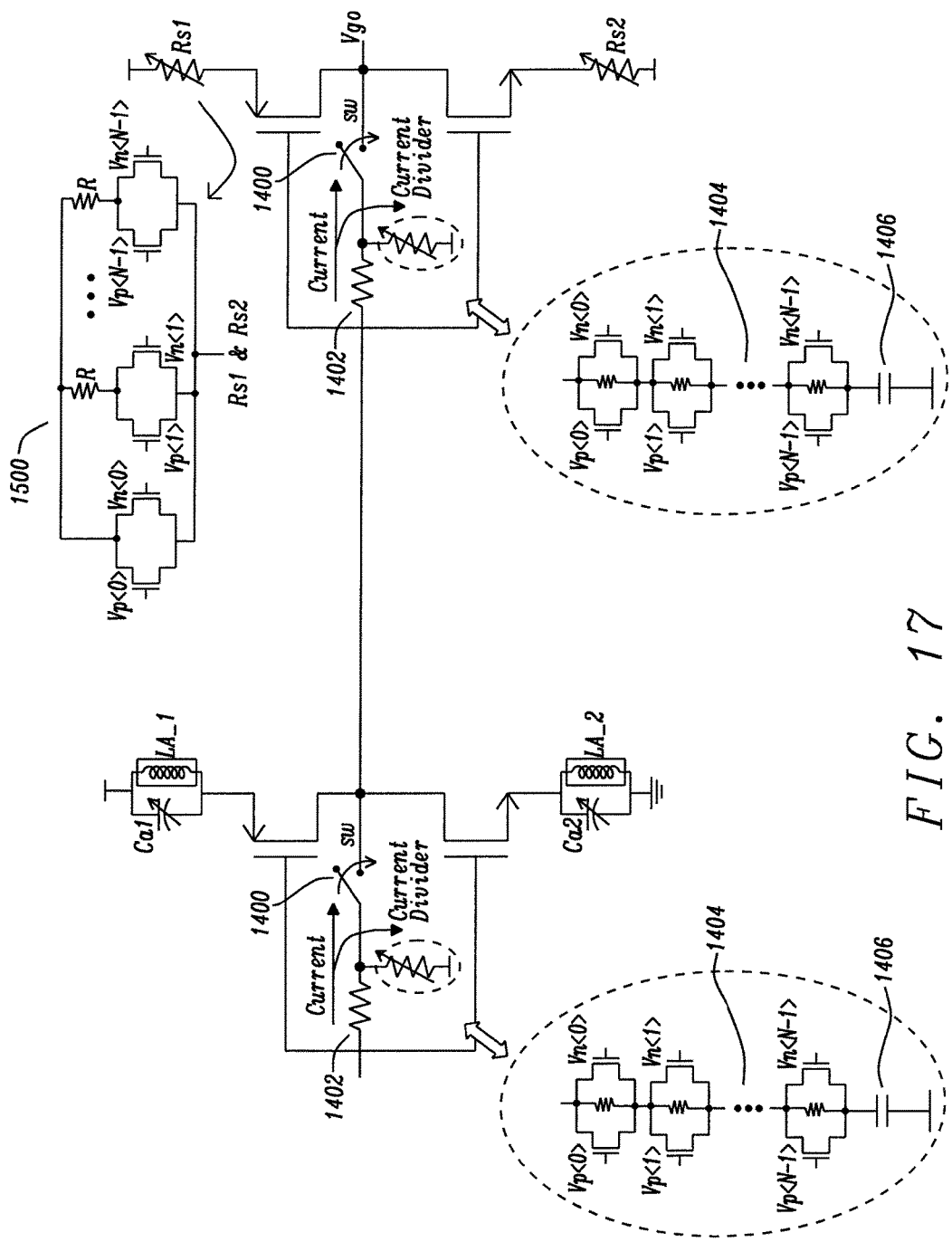
FIG. 17 shows an embodiment of the gate drive circuit using the feedback resistor and tunable resistor embodiments as shown in FIG. 14 and FIG. 15, respectively.

FIG. 17 shows how the resistor networks of the feedback resistors rf1, rf2 and the tunable resistors Rs1, Rs2 are implemented in the gate drive circuit 1110 using the embodiments shown in FIGS. 14, 15 and 16.

Figure 18:
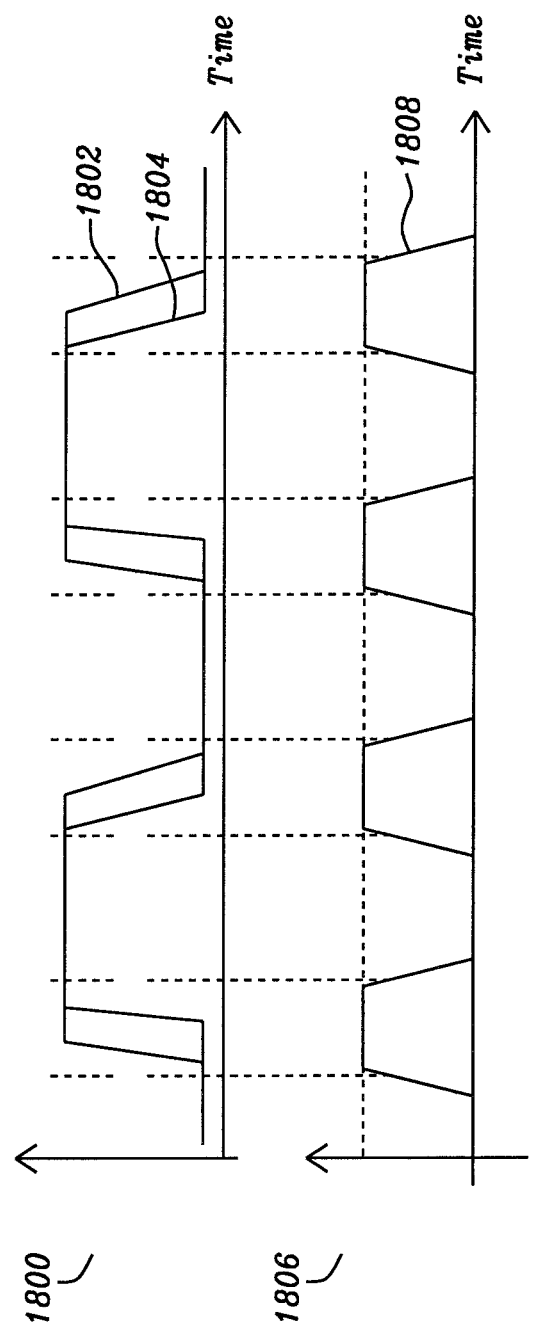
FIG. 18 shows the relative timing between the operation of the current blocking switches and a high side gate voltage and a low side gate voltage.

FIG. 18 shows the relative timing between the current blocking switches of the feedback resistors rf1, rf2 and the high side gate voltage gh, and the low side gate voltage gl. The high side gate voltage gh, and the low side gate voltage gl are non-overlapping signals. A first timing plot 1800 shows the high side gate voltage gh 1802 and the low side gate voltage gl 1804.

A second timing plot 1806 shows a state 1808 of the current blocking switches 1400 of the feedback resistors rf1, rf2, where a high signal corresponds to the switch being closed, or on, and a low signal corresponds to the switch being open, or off.

Figure 19:
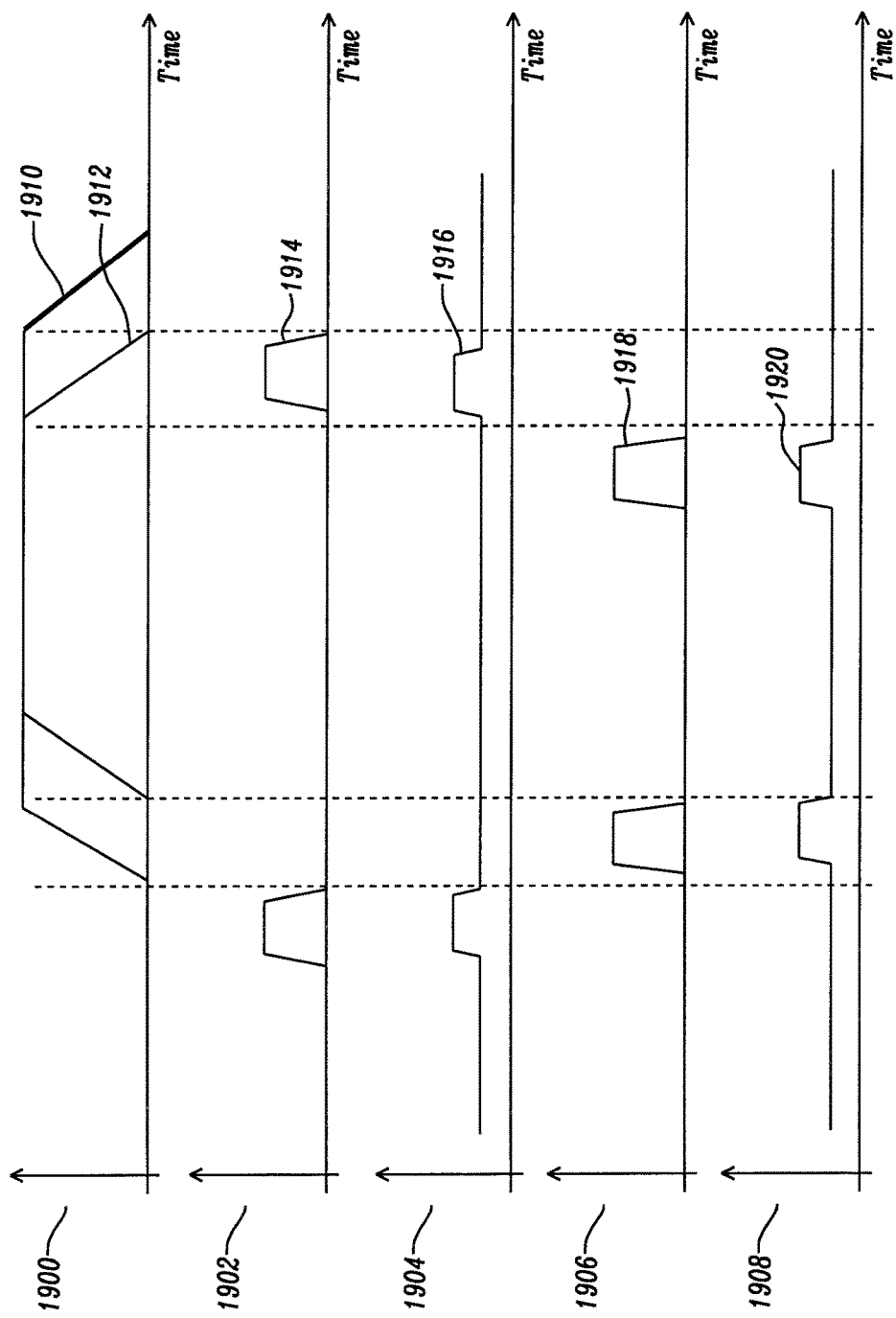
FIG. 19 shows control timing of the pre-drive switches.

FIG. 19 shows control timing of the pre-drive switches 1501 at the first gate drive circuit 1110a and the second gate drive circuit 1110b. A first timing plot 1900 shows the high side gate voltage gh 1910 and the low side gate voltage gl 1912. A second timing plot 1902 shows a state 1914 of the pre-drive switches 1501 of the tunable resistors Rs1, Rs2, of the first gate drive circuit 1110a. A third timing plot 1904 shows an effective gain, 1916 of the first gate drive circuit 1110a. A fourth timing plot 1906 shows a state 1918 of the pre-drive switches 1501 of the tunable resistors Rs1, Rs2 of the second gate drive circuit 1110b. A fifth timing plot 1908 shows an effective gain, 1920 of the second gate drive circuit 1110b.

A high signal on the second and fourth timing plots 1902, 1906 correspond to the pre-drive switch 1501 being switched on, such that the variable resistors Rs1, Rs2 have a resistance of approximately zero. The variable resistors Rs1, Rs2 of the first gate drive circuit 1110a are shorted momentarily prior to the transition of the high side gate voltage gh 1910, shown by a switching to a low signal on the second timing plot 1902. The variable resistors Rs1, Rs2 of the second gate drive circuit 1110b are shorted momentarily prior to the transition of the low side gate voltage gl 1912, shown by a switching to a low signal on the fourth timing plot 1906. This is to create a maximum charge transferring capacity before the transition.

Figure 20:
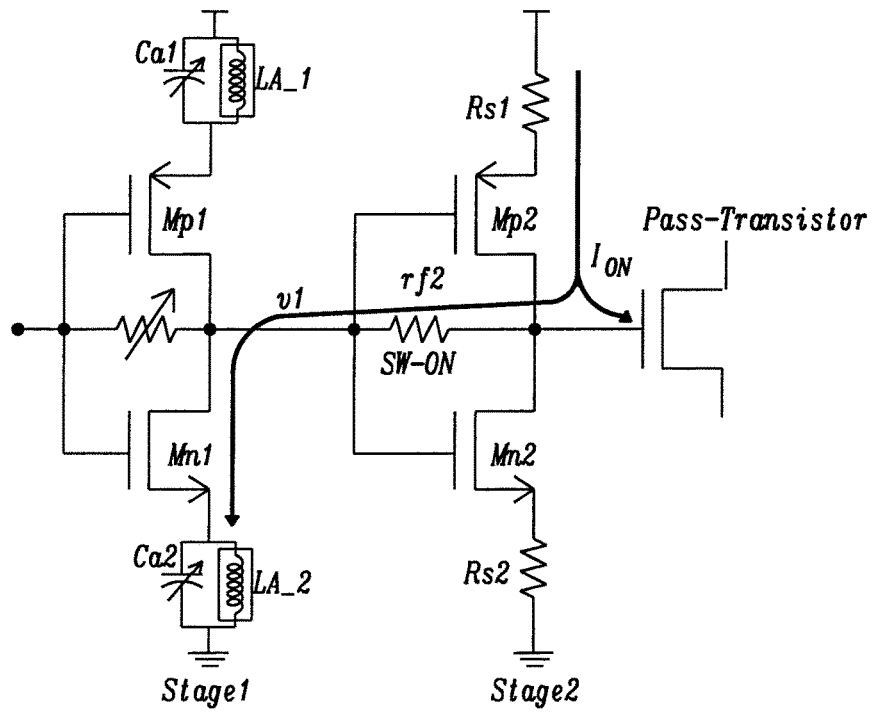
FIG. 20 shows the gate drive circuit with a distracting current scheme from a pull up current.
Figure 21:
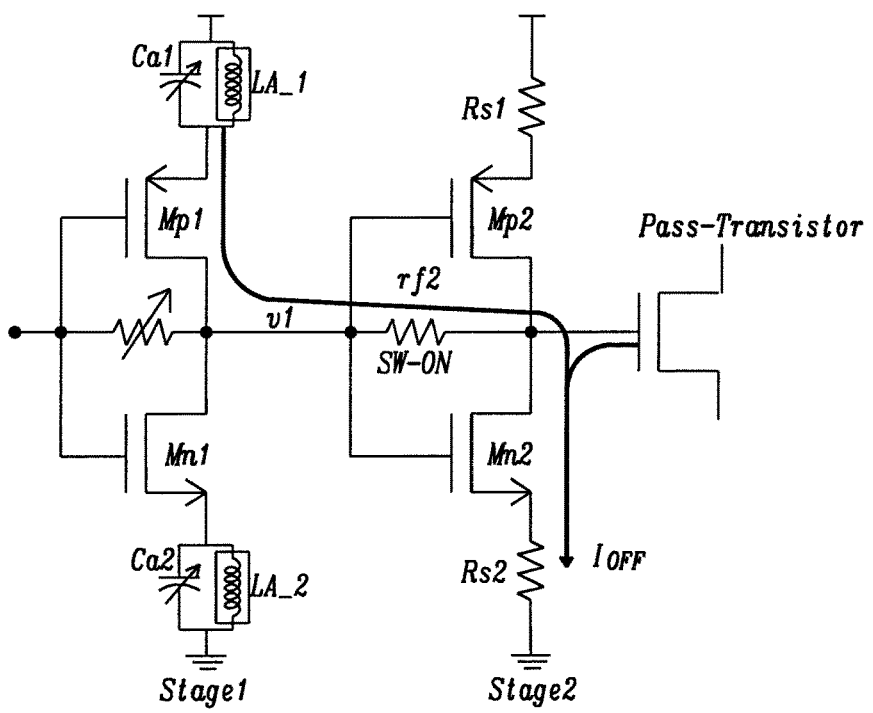
FIG. 21 shows the gate drive circuit with a distracting current scheme from a pull down current.

FIG. 20 and FIG. 21 show large signal operations. The transition slope can be optimised because of a distracting current scheme which is a result of an additional current path through the feedback resistor rf2. FIG. 20 shows the distracting current scheme from a pull up current ION which provides a decreased transition slope of the gate driving signal. FIG. 21 shows the distracting current scheme from a pull down current $I_{OFF}$ which provides a decreased transition slope of the gate driving signal.

Figure 22:
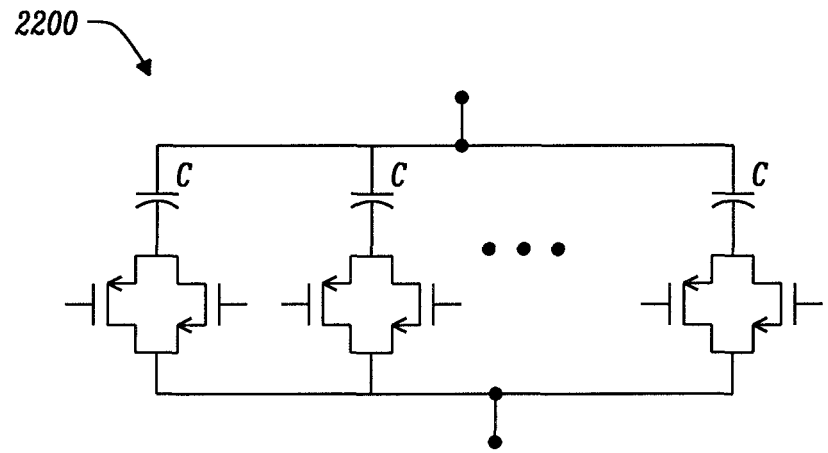
FIG. 22 shows an embodiment of a programmable capacitor.

FIG. 22 shows an embodiment of the programmable capacitors Ca1, Ca2. The programmable capacitors Ca1, Ca2 comprise a programmable capacitor string 2200 comprising a plurality of capacitors C and a plurality of transmission gates. Each capacitor C is coupled in series with a transmission gate to form a capacitor element. The capacitor elements are connected in parallel with each other. The programmable capacitor string may be programmed as described in FIG. 14 for the series and shunt resistor strings 1402, 1404.

Configurations of the programmable circuits presented in this disclosure, corresponding to the programmable capacitors Ca1, Ca2; the feedback resistors rf1, rf2; and the tunable resistors Rs1, Rs2, can be performed by auto-detection (whereby components can be provided to sense the overshoot/undershoot voltage and convert the detected amount into an electrical parameter such as a voltage or current as a feedback signal), or a manual change of register contents based on testing results. Registers are configurable memory devices which are used for the default control settings for the whole system.

Configurations of the programmable circuits may be set based on different schemes. For example, during a design phase, provide a nominal setting on the programmable circuits based on PVT simulations. Alternatively, during silicon validation, the programmable circuits can be adjusted by users if the results are outside a specification. The resolutions of the programmable circuits may be determined by design and an external trimming process is not required.

Figure 23:
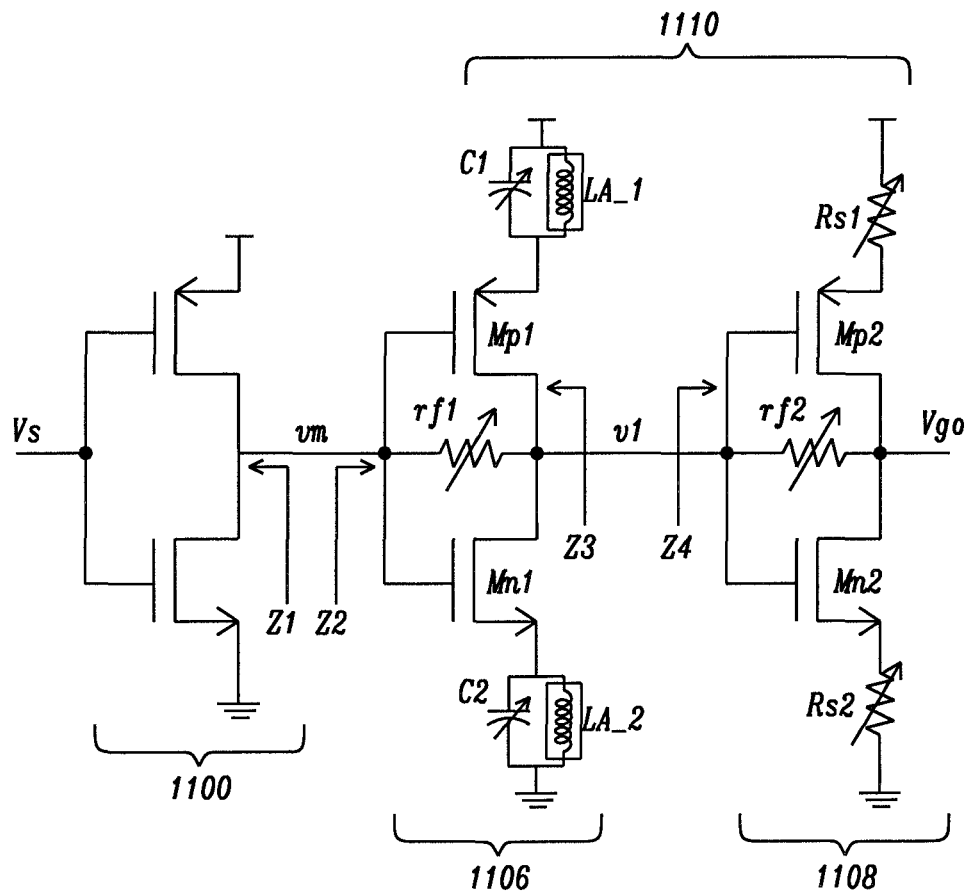
FIG. 23 shows input and output impedances at stages of the buffer circuit and the gate drive circuit.

FIG. 23 shows a circuit showing input and output impedances within the buffer circuit 1100 and gate drive circuit 1110. FIG. 23 shows an output impedance Z1 of the buffer circuit, an input impedance of the first stage Z2, and output impedance of the first stage Z3 and an input impedance of the second stage Z4. The buffer circuit receives an input voltage Vs and outputs a voltage vm. The first stage 1106 outputs a voltage v1. The second stage 1108 outputs a voltage vgo. The circuit shown in FIG. 23 is analysed for three different impedance states.

1) When Z1 and Z4 are high and Z2 (or rf1) is low, the first stage 1106 act as a trans-impedance stage with source degeneration, with a transfer function as follows.

$$\frac{V_1}{V_S} = \frac{V_1}{I_{buff}} \frac{I_{buff}}{V_s} = \left(rf1 - \frac{1}{g^*_{m_{stg1}}}\right) \cdot g_{m_{buff}}$$

where
$I_{buff}$ is an AC current produced by the buffer circuit 1100, and the buffer circuit 1100 has a transconductance given by $$g_{m_{buff}} = \frac{I_{buff}}{V_s}$$

The first stage 1106 has an effective transconductance $g^*_{m_{stg1}}$ and a source degeneration impedance $Z_{LC}$. The transistors Mp1 and Mn1 have a total transconductance $g_{m_{stg1}}$.

$$g^*_{m_{stg1}} = \frac{g_{m_{stg1}}}{1 + g_{m_{stg1}} \cdot Z_{LC}}$$

and $$Z_{LC} = \left(\frac{1}{sC} \parallel sL\right) = \frac{sL}{1 + s^2(LC)}$$

Therefore $$\frac{V_1}{I_{buff}} = \left(rf1 - \frac{1}{g_{m_{stg1}}} - \left(\frac{sL}{1 + s^2(LC)}\right)\right)$$

at a frequency $$f = \frac{1}{2\pi} \frac{1}{\sqrt{LC}}$$

$$\frac{V_1}{I_{buff}} \rightarrow \text{minimum}$$

There is a band-stop response at a LC resonant frequency.

2) When Z1 and Z3 are low and Z2 and Z4 (or rf1 and rf2) are high, the first stage 1106 acts as a voltage gain stage (with source degeneration) with a transfer function as follows.

$$\frac{V_1}{V_m} \approx -rf1 \cdot g^*_{m_{stg1}} = -\frac{rf1 \cdot g_{m_{stg1}}}{1 + g_{m_{stg1}} \cdot Z_{LC}}$$

at a frequency $$f = \frac{1}{2\pi} \frac{1}{\sqrt{LC}}$$

$$|Z_{LC}| \rightarrow \text{maximum}$$

$$\left|\frac{V_1}{V_m}\right| \rightarrow \text{minimum}$$

In this voltage amplification operational mode, the band-stop response is also generated.

3) When Z3 are low and Z4 (or rf2) are high, the second stage 1108 acts as a voltage gain stage (with source degeneration), with a transfer function as follows.

$$\frac{V_{go}}{V_1} \approx -rf2 \cdot g^*_{m_{stg2}} = -\frac{rf2 \cdot g_{m_{stg2}}}{1 + g_{m_{stg2}} \cdot R_S}$$

A gain magnitude of the second stage 1108 is given by:

$$\left|\frac{V_{go}}{V_1}\right| \approx \left|\frac{rf2 \cdot g_{m_{stg2}}}{1 + g_{m_{stg2}} \cdot R_S}\right| \approx \frac{rf2}{R_S}$$

It can be seen that the gain magnitude of the second stage 1108 can be adjusted by the second feedback resistor rf2, or a source degenerative resistor $R_S$ derived from Rs1, Rs2.

The gate drive circuits present a two-step transition when the gate drive signal switches from a low state to a high state, or from a high state to a low state. During a first step, the first stage and the second stage act like linear amplifiers with the first gate driver inductor LA_1 and the second gate driver inductor LA_2 acting as operational active inductors. The gain magnitude is given by $$\left|\frac{V_{go}}{V_1}\right| \approx \frac{rf2}{R_S}$$

corresponding to the third impedance state. As the gate drive circuit uses a Cherry-Hooper topology in this mode, the gate drive circuit can drive a large capacitive load at a transistor gate and can also suppress an oscillatory frequency band due to the resonant circuit.

At a second step the voltage v1 and the voltage vgo move towards a voltage Vdd or ground and thus all transistors are in either a cut off mode or in a triode mode. Therefore, leakage noise is minimised.

Figure 24:
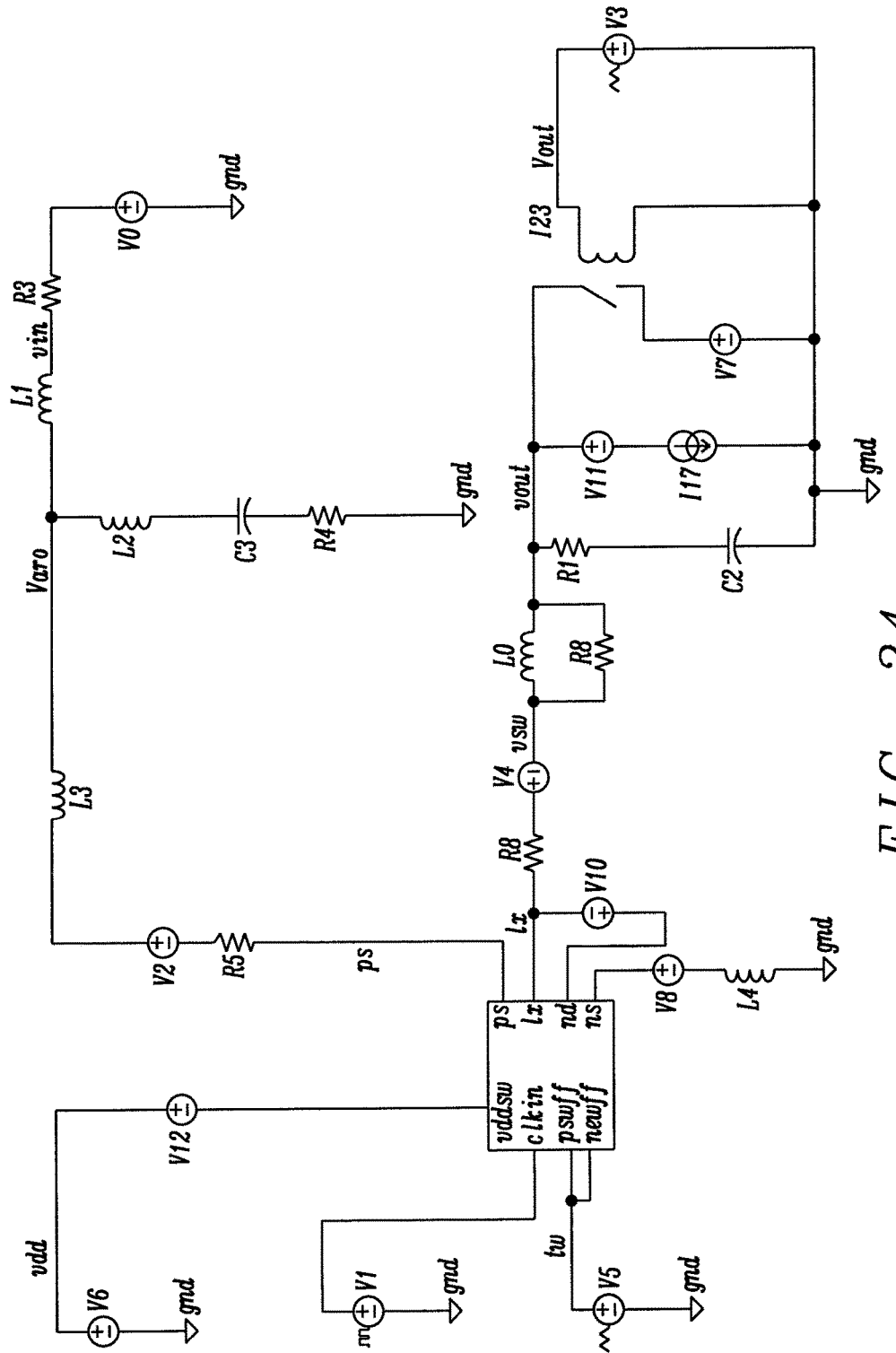
FIG. 24 shows a schematic of the simulated gate drive circuit.

Simulations have been performed on a simulation test bench with a circuit as shown in FIG. 24 for a complementary pass transistor scheme. The parasitic elements, given by discrete components, packaging and a PCB have been included in the simulations.

Figure 25:
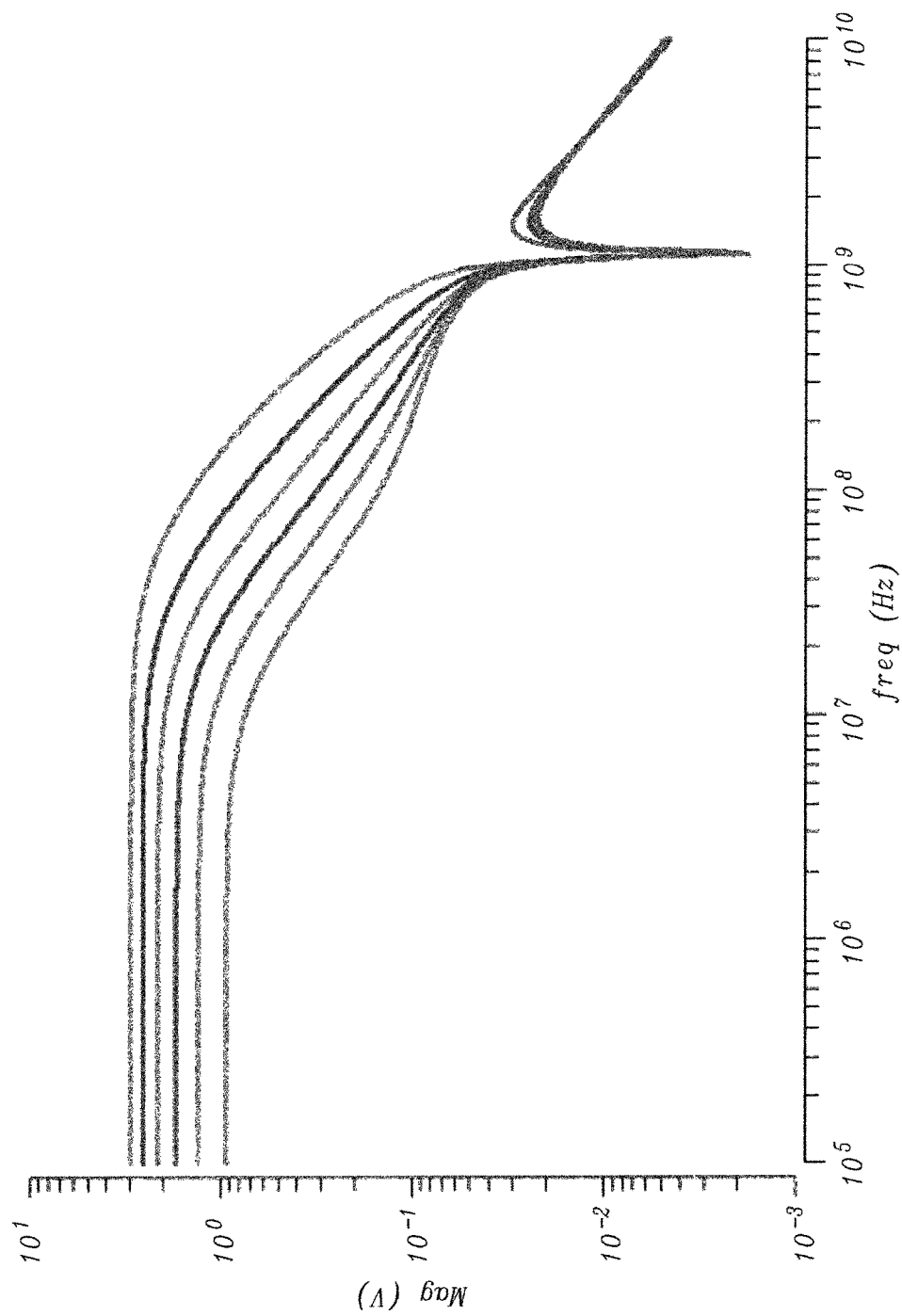
FIG. 25 shows a gain-frequency plot of the simulated gate drive circuit for varying tunable resistor values.

FIG. 25 shows a gain-frequency plot of the gate drive circuit where the values of the source degenerative resistors, previously referred to as the first tunable resistor Rs1 and the second tunable resistor Rs2, are varied. A band stop response can be seen at 1 GHz which corresponds to an LC resonant frequency.

Figure 26:
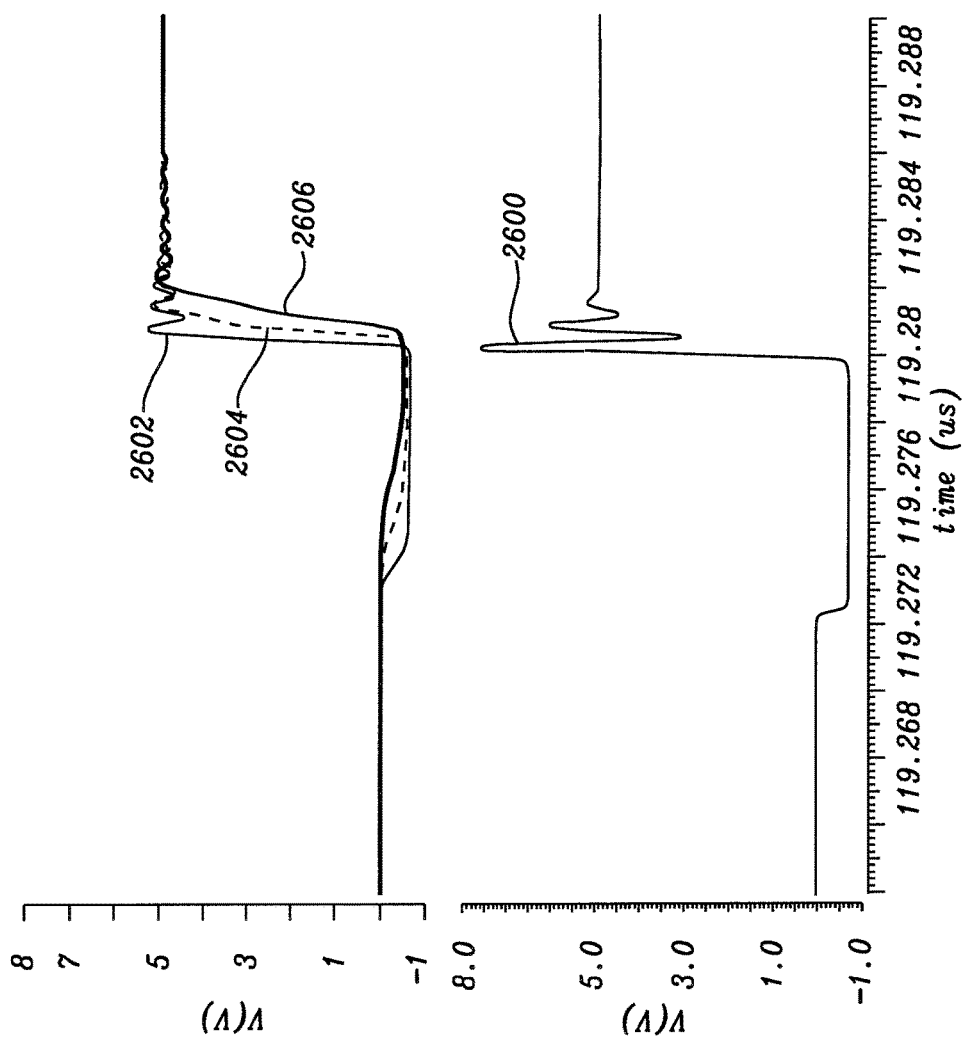
FIG. 26 shows simulation results for no compensation and for three compensation settings.

FIG. 26 shows a reduction in the ringing at the PMIC output port Lx. A first trace 2600 shows a hard switching case with no compensation setting such as time or frequency domain techniques to adjust the transition slope. A second trace for a first compensation setting 2602, a third trace for a second compensation setting 2604 and a fourth trace for a third compensation setting 2606. Traces 2602, 2604 and 2606 are obtained by varying the values of the first tunable resistor Rs1 and the second tunable resistor Rs2, and by using optimised values for the feedback resistors rf1, rf2 to align the resonant frequency to the desired band-stop region. The hard switching case for the first trace 2600 show a maximum oscillatory amplitude of 4540 mV. An improved ringing magnitude for the second trace 2602 shows 791 mV, for the third trace 2604 shows 490 mV, and for the fourth trace 2606 shows 350 mV. This is equivalent to ringing reductions of 82%, 89% and 92%, respectively.

Figure 27:
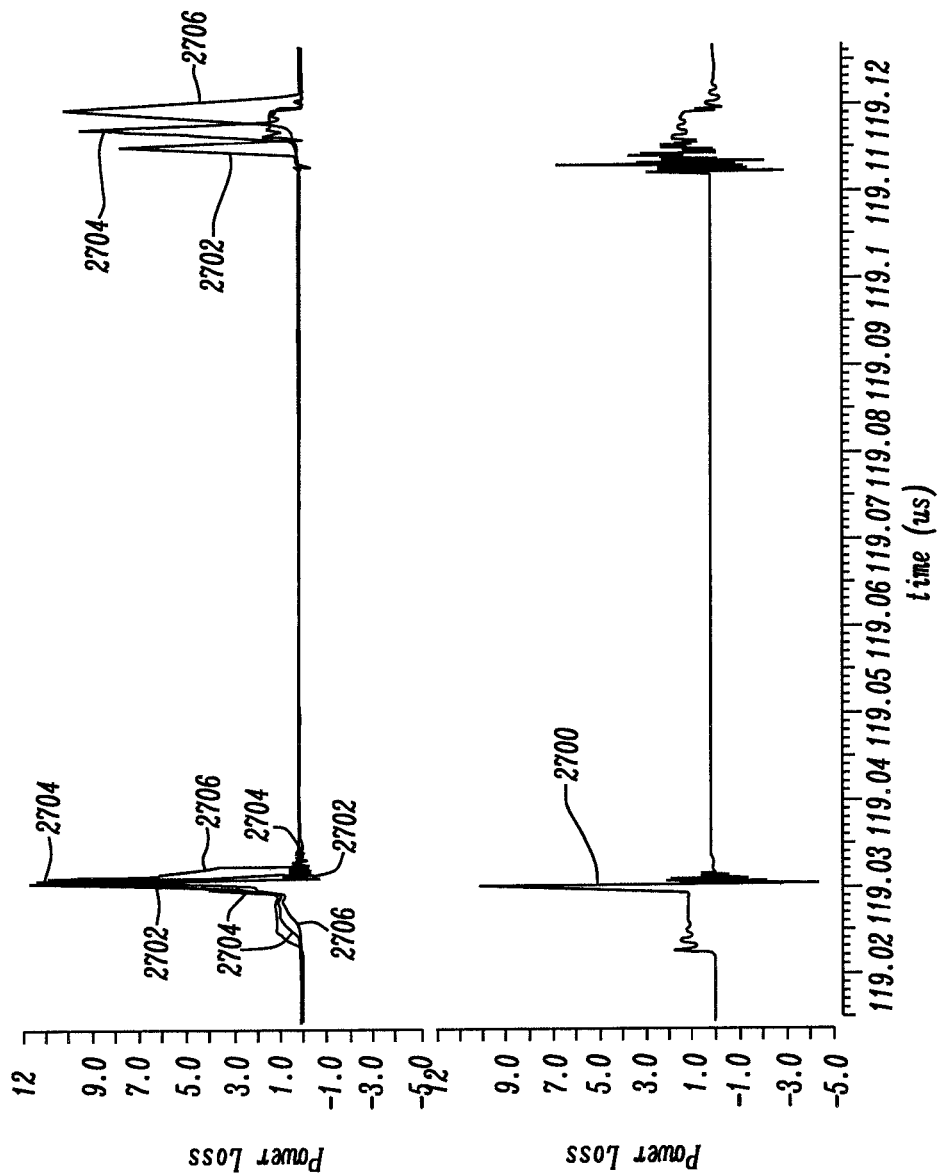
FIG. 27 shows power loss comparison between the no compensation and the three compensation settings.

FIG. 27 shows power loss for the hard switching case 2700 and for the first compensation setting 2702, the second compensation setting 2704 and the third compensation setting 2706.

Figure 28:
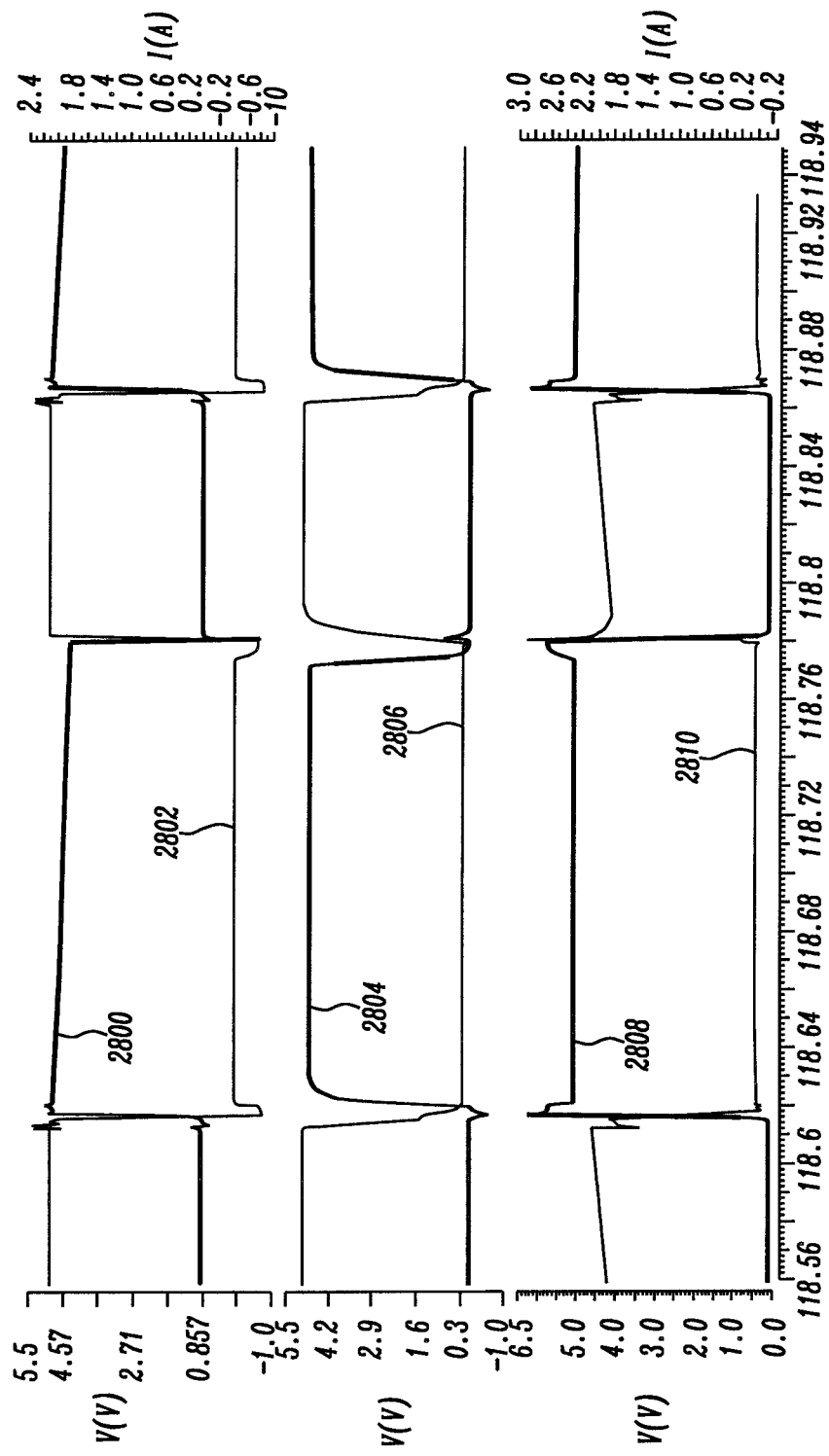
FIG. 28 shows simulation results of the gate drive circuit.

FIG. 28 shows simulation results for the gate drive circuit. The simulation results shown are as follows: a current through the n-type transistor 2800, a voltage at the PMIC output port Lx 2802, a low side gate voltage gl 2804 and a current through the p-type transistor 2810.

Prior art methods, using time domain concepts and circuits, can only perform partial functions, such as adjustment of the second break point, when compared to the gate drive circuit of this disclosure. It is impossible for the prior approaches to correct the ringing behaviours.

Additionally, the major functions of the gate-drive circuits are mainly performed within the transition time. However, the updating mechanism of the tunable devices and the control-timing occur mostly during the steady state of the driving signals. The inverter based schematics are compatible to rail-to-rail digital-mode operations. In addition, the proposed gate drive circuits also offer advantages in gain-bandwidth control during the transient behaviours.

The gate drive circuits supports an open-loop control through manual inputs of control-registers so that the default control-timing and values of the tunable-devices can be updated for best performance. Therefore, the difficulties resulting from the tight closed-loop timing in prior art can be alleviated.

Various improvements and modifications can be made to the above without departing from the scope of the disclosure.

What is claimed is:

1. A gate drive circuit arranged to receive an input signal and provide an output signal to drive a gate of a transistor, wherein the output signal is derived from the input signal; and comprising a filter circuit arranged to attenuate a frequency band from the input signal when deriving the output signal from the input signal, wherein the frequency band is a frequency region where an overshoot, an undershoot or an oscillatory waveform is generated during operation.

2. The gate drive circuit of claim 1, wherein the output signal is suitable for switching the transistor between a first state and a second state.

3. The gate drive circuit of claim 1, wherein the filter circuit comprises a resonant circuit.

4. The gate drive circuit of claim 1, wherein the filter circuit comprises a plurality of programmable resistive elements, comprising: a first programmable resistive element arranged to adjust a low frequency gain and bandwidth of the gate drive circuit; a second programmable resistive element arranged to adjust a high frequency gain of the gate drive circuit; and a pair of programmable resistive elements arranged to adjust a driving gain of the gate drive circuit.

5. The gate drive circuit of claim 4, wherein the high frequency gain is at a higher frequency than the low frequency gain.

6. The gate drive circuit of claim 5, wherein frequency regions defined by the high and low frequency gains do not overlap.

7. The gate drive circuit of claim 5, wherein one more of the programmable resistive elements comprises a plurality of resistive elements that are coupled to each other and wherein each resistive element comprises a transmission gate coupled to a resistor.

8. The gate drive circuit of claim 4, wherein one or more of the programmable resistive elements comprises a current-blocking switch arranged to limit a DC current flow when the output signal is in a high state or a low state.

9. The gate drive circuit of claim 3, wherein the resonant circuit comprises an inductor and a capacitor, wherein the capacitor may be a programmable capacitor.

10. The gate drive circuit of claim 1, wherein the filter circuit comprises a first stage arranged to modify the frequency spectrum of the input signal in the derivation of the output signal; and a second stage arranged to provide a driving gain sufficient to switch the transistor from a first state to a second state.

11. The gate drive circuit of claim 10, wherein the first stage comprises a resonant circuit.

12. The gate drive circuit of claim 1, wherein the input signal is a digital control signal.

13. A DC-DC converter comprising at least one transistor and at least one gate drive circuit associated with the transistor; said gate drive circuit arranged to receive an input signal and provide an output signal to drive a gate of the transistor, wherein the output signal is derived from the input signal; and comprising a filter circuit arranged to attenuate a frequency band from the input signal when deriving the output signal from the input signal, wherein the frequency band is a frequency region where an overshoot, an undershoot or an oscillatory waveform is generated during operation.

14. A method of driving a gate of a transistor, comprising receiving an input signal and deriving an output signal from said input signal; and wherein said deriving an output signal comprises attenuating a frequency band from the input signal, wherein the frequency band is a frequency region where an overshoot, an undershoot or an oscillatory waveform is generated during operation.

15. The method of claim 14, wherein a filter circuit performs said attenuating said frequency band from said input signal.

16. The method of claim 15, wherein the filter circuit comprises a plurality of programmable resistive elements, comprising: a first programmable resistive element arranged to adjust a low frequency gain and bandwidth of the gate drive circuit; a second programmable resistive element arranged to adjust a high frequency gain of the gate drive circuit; and a pair of programmable resistive elements arranged to adjust a driving gain of the gate drive circuit.

17. The method of claim 16, wherein the high frequency gain is at a higher frequency than the low frequency gain.

18. The method of claim 17, wherein frequency regions defined by the high and low frequency gains do not overlap.

19. The method of claim 16, wherein one more of the programmable resistive elements comprises a plurality of resistive elements that are coupled to each other and wherein each resistive element comprises a transmission gate coupled to a resistor.

20. The method of claim 16, wherein one or more of the programmable resistive elements comprises a current-blocking switch arranged to limit a DC current flow when the output signal is in a high state or a low state.

21. The method of claim 14, wherein the filter circuit comprises a first stage arranged to modify the frequency spectrum of the input signal in the derivation of the output signal; and a second stage arranged to provide a driving gain sufficient to switch the transistor from a first state to a second state.

22. The method of claim 14 wherein the input signal is a digital control signal.

\* \* \* \* \*